United States Patent
Kang et al.

(10) Patent No.: US 8,054,682 B2
(45) Date of Patent: Nov. 8, 2011

(54) NON-VOLATILE MEMORY DEVICE AND PAGE BUFFER CIRCUIT THEREOF

(75) Inventors: Kyung-Min Kang, Anyang-si (KR); Sangwon Hwang, Suwon-si (KR); Jong-Nam Baek, Seoul (KR)

(73) Assignee: Samsung Electronics Co., Ltd. (KR)

(*) Notice: Subject to any disclaimer, the term of this patent is extended or adjusted under 35 U.S.C. 154(b) by 121 days.

(21) Appl. No.: 12/460,940

(22) Filed: Jul. 27, 2009

(65) Prior Publication Data

US 2010/0074011 A1    Mar. 25, 2010

(30) Foreign Application Priority Data

Sep. 23, 2008    (KR) .................. 10-2008-0093268

(51) Int. Cl.
  *G11C 11/34*    (2006.01)
(52) U.S. Cl. .............................. 365/185.03; 365/185.24
(58) Field of Classification Search ............. 365/185.03, 365/185.24
  See application file for complete search history.

(56) References Cited

U.S. PATENT DOCUMENTS

| | | | |
|---|---|---|---|
| 7,245,528 B2 | 7/2007 | Shibata et al. | |
| 7,376,009 B2 | 5/2008 | Shibata et al. | |
| 2005/0105337 A1* | 5/2005 | Cohen et al. | 365/185.18 |
| 2005/0169057 A1 | 8/2005 | Shibata et al. | |
| 2007/0115726 A1* | 5/2007 | Cohen et al. | 365/185.19 |
| 2007/0136563 A1 | 6/2007 | Park et al. | |
| 2007/0183210 A1* | 8/2007 | Choi et al. | 365/185.22 |
| 2007/0253250 A1 | 11/2007 | Shibata et al. | |
| 2008/0219058 A1 | 9/2008 | Shibata et al. | |
| 2009/0052240 A1* | 2/2009 | Kim et al. | 365/185.03 |
| 2009/0147573 A1* | 6/2009 | Hemink | 365/185.03 |

FOREIGN PATENT DOCUMENTS

| | | |
|---|---|---|
| JP | 2005-243205 | 9/2005 |
| JP | 2006-351178 B1 | 12/2006 |
| KR | 10-0618902 | 8/2006 |
| KR | 10-0688369 | 2/2007 |
| KR | 10-2008-0030276 A | 4/2008 |

\* cited by examiner

*Primary Examiner* — Michael Tran
(74) *Attorney, Agent, or Firm* — Onello & Mello LLP

(57) ABSTRACT

A non-volatile memory device includes a cell array including a plurality of memory cells, a page buffer block controlling bitlines of the plurality of memory cells to program the memory cells to a first target state or a second target state, and a control logic configured to skip a verify operation for the memory cells programmed to the first target state and perform a verify operation for the memory cells programmed to the second target state during a second program loop when the memory cells programmed to the first target state are determined to be in a pass condition during a first program loop.

18 Claims, 16 Drawing Sheets

Fig. 5B

| Target State | Main | | Cache | |
|---|---|---|---|---|
| | A | B | C | D |
| E0 | - | - | 1 | 0 |
| P1 | - | - | 0 | 1 |
| P2 | - | - | 0 | 1 |
| P3 | - | - | 1 | 0 |

Fig. 6B

| Target State | Main | | Cache | |
|---|---|---|---|---|
| | A | B | C | D |
| E0 | 1 | 0 | 1 | 0 |
| P1 | 1 | 0 | 0 | 1 |
| P2 | 1 | 0 | 0 | 1 |
| P3 | 1 | 0 | 1 | 0 |

| Current State | Target State | Main Latch | | Cache Latch | |
|---|---|---|---|---|---|
| | | A | B | C | D |
| E0 | E0 | 1 | 0 | 1 | 0 |
| E0 | P1 | 1 | 0 | 0 | 1 |
| P0 | P2 | 0 | 1 | 0 | 1 |
| P0 | P3 | 0 | 1 | 1 | 0 |
| P0* | P2 | 1 | 0 | 0 | 1 |

Inverse Read   Normal Read

NON-VOLATILE MEMORY DEVICE AND PAGE BUFFER CIRCUIT THEREOF

CROSS-REFERENCE TO RELATED APPLICATION

This U.S. non-provisional patent application claims priority under 35 U.S.C §119 to Korean Patent Application No. 10-2008-0093268, filed in the Korean Intellectual Property Office on Sep. 23, 2008, the entirety of which is herein incorporated by reference.

BACKGROUND

1. Technical Field

The present invention relates generally to semiconductor memory devices and, more specifically, to a flash memory device and a page buffer circuit of the flash memory device.

2. Description of Related Art

Semiconductor memory devices can be typically categorized into two types: volatile memory devices and non-volatile memory devices. Volatile memory devices lose their stored data when their power supplies are interrupted, while being capable of achieving high-speed read and write operations. Non-volatile memory devices retain their stored data even when their power supplies are interrupted. Thus, non-volatile memory devices are widely used to store data which should be retained irrespective of whether their power supplies are interrupted. Non-volatile memory devices include, for example, mask read-only memories (MROMs), programmable read-only memories (PROMs), erasable programmable read-only memories (EPROMs), and electrically erasable programmable read-only memories (EEPROMs).

In MROM, PROM, and EPROM devices, it is inconvenient to erase and write data and, therefore, it is generally difficult to update the contents stored therein. On the other hand, data stored in EEPROM devices can be electrically programmed and erased and, therefore, the use of EEPROM devices is increasingly becoming popular in auxiliary memory devices and system programming devices that require continuous updating of contents. In particular, flash memory devices are advantageously applied to large-capacity auxiliary memory devices because they provide higher integration density than conventional EEPROM devices.

A flash memory device is an integrated circuit which is capable of storing and reading data at any time. A flash memory device includes a plurality of reprogrammable memory cells each storing 1-bit data or multi-bit data therein. When 1-bit data is stored in one memory cell, the memory cell program states correspond to two threshold voltage distributions. That is, the memory cell is programmed to have a threshold voltage corresponding to either one of data "1" and data "0". A multi-level cell (MLC) including a plurality of memory cells configured to store multi-bit data therein has more program states. Namely, when 2-bit data is stored in one memory cell, the memory cell is programmed to a threshold voltage included in four threshold voltage distributions. When 3-bit data is stored in one memory cell, the memory cell is programmed to a threshold voltage included in eight threshold voltage distributions. Recently, various attempts have been made to store 4-bit data in one memory cell.

SUMMARY

According to a first aspect of the present invention, a non-volatile memory device may include: a cell array including a plurality of memory cells; a page buffer block controlling bitlines of the plurality of memory cells to program the memory cells to a first target state or a second target state; and a control logic configured to skip a verify operation for the memory cells programmed to the first target state and perform a verify operation for the memory cells programmed to the second target state during a second program loop when the memory cells programmed to the first target state are determined to be in a pass condition during a first program loop.

In one embodiment, the first program loop includes: an operation for providing a program voltage to a wordline of the plurality of memory cells; a verify-read operation for the memory cells programmed to the first target state and the memory cells programmed to the second target state; and a column scan operation for determining whether the memory cells programmed to the first target state and the second target state are in the pass condition according to the verify-read operation.

In one embodiment, when the memory cells programmed to the first target state are determined to be in the pass condition according to the column scan operation, the control logic controls the page buffer block to skip the verify-read operation the column scan operation for the memory cells programmed to the first target state during the second program loop.

In one embodiment, the page buffer block includes a plurality of page buffers, each of the page buffers comprising: a sensing node connected to a bitline of a selected memory cell; a first latch configured to store data sensed from the selected memory cell through the sensing node; a second latch configured to store data to be programmed to the selected memory cell; an output node for outputting the data of the first latch; and a ground circuit configured to ground the sensing node or the output node with reference to the second latch.

The non-volatile memory device may further include: a first transistor connecting the sensing node to the ground circuit during the verify-read operation for the memory cells programmed to the first target state; and a second transistor connecting the output node to the ground circuit during the column scan operation for the memory cells programmed to the first target state.

In one embodiment, the second latch corresponding to the memory cells programmed to the second target state has a logic state to activate the second latch during the verify-read operation or the column scan operation for the memory cells programmed to the first target state.

In one embodiment, the ground circuit includes a ground transistor having a gate connected to the second latch and switching between a ground and a common source of the first and second transistors.

The non-volatile memory device may further include: a third transistor connecting the second transistor to the output node during the column scan operation for the memory cells programmed to the first target state and the second target state.

In one embodiment, when a result of the column scan operation for the memory cell programmed to the first target state is determined to be in the pass condition, an activation operation of the first and second transistors is skipped during the second program loop.

In one embodiment, the first target state has a threshold voltage distribution where the first target state is lower than the second target state, and the plurality of memory cells are simultaneously programmed to the first target state or the second target state.

According to another aspect of the present invention, a non-volatile memory device including a plurality of memory cells may include: a sensing node connected to a bitline of a selected memory cell; a first latch configured to store sensed data from the selected memory cell through the sensing node; a second latch configured to store data to be programmed to the selected memory cell; an output node for outputting the sensed data of the first latch; a ground circuit configured to activate or deactivate a verify-read operation through the sensing node or a column scan operation through the output node with reference to the data to be programmed of the second latch; and a verify circuit connecting the sensing node to the ground circuit during the verify-read operation and connecting the output node to the ground circuit during the column scan operation.

In one embodiment, the sensed data is LSB data programmed to the selected memory cell, and the data to be programmed is MSB data to be programmed to the selected memory cell.

In one embodiment, the selected memory cell is set to be programmed to a first target state or a second target state having a threshold voltage distribution where the second target state is higher than the first target state according to the LSB data or the MSB data.

In one embodiment, the ground circuit is turned on when the MSB data stored in the second latch corresponds to the second target state.

In one embodiment, the verify circuit includes: a first transistor connecting the sensing node to the ground circuit during a verify-read operation corresponding to the first target state; a second transistor connecting the output node to the ground circuit during a column scan operation corresponding to the first target state; and a third transistor connecting the second transistor to the output node during the column scan operation corresponding to the first target state and a column scan operation corresponding to the second target state.

In one embodiment, when the selected memory cell is determined to be programmed to the first target state during the column scan operation, the first and second transistors are controlled to be blocked during subsequent program loops.

In one embodiment, when LSB page data sensed from the selected memory cell through the sensing node is stored, the first latch is set to be program-inhibited if the stored LSB page buffer is within a threshold voltage range.

In one embodiment, the ground circuit is a ground transistor having a gate connected to the second latch.

According to another aspect of the present invention, a memory system may include a non-volatile memory device and a controller configured to control the non-volatile memory device. The non-volatile memory device may include: a cell array including a plurality of memory cells; a page buffer block controlling bitlines of the plurality of memory cells to program the memory cells to a first target state or a second target state; and a control logic configured to skip a verify operation for the memory cells programmed to the first target state and perform a verify operation for the memory cells programmed to the second target state during a second program loop when the memory cells programmed to the first target state are determined to be in a pass condition during a first program loop.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIG. 5B is a table illustrating a setting result of the cache latch shown in FIG. 5A.

FIG. 6B is a table illustrating states of an initialized main latch and a cache latch according to an embodiment of the present invention.

DETAILED DESCRIPTION OF THE EMBODIMENTS

The present invention will now be described more fully hereinafter with reference to the accompanying drawings, in which exemplary embodiments of the present invention are shown. This invention may, however, be embodied in different forms and should not be construed as limited to the exemplary embodiments set forth herein. Rather, these exemplary embodiments are provided so that this description will be thorough and complete, and will fully convey the present invention to those skilled in the art. Like numbers refer to like elements.

In the description herein, a NAND flash memory device is used as one example for illustrating characteristics and functions of the present invention. However, those skilled in the art can easily understand other advantages and performances of the present invention according to the descriptions. The present invention may be embodied or applied through other embodiments. In addition, the embodiments described in detail herein may be amended or modified according to viewpoints and applications, not being out of the scope, technical idea and other objects of the present invention.

Figure 1:
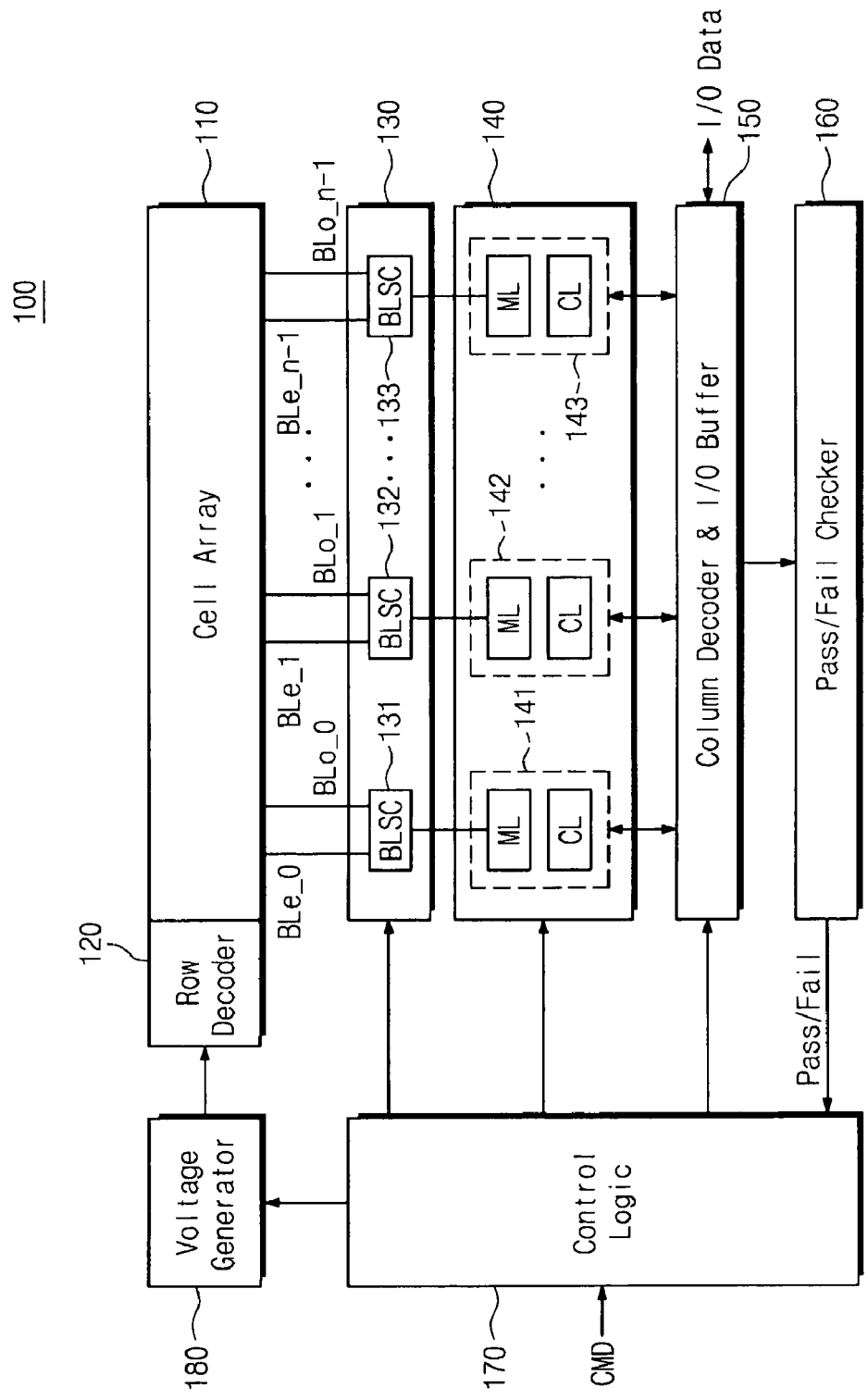
FIG. 1 is a block diagram of a memory device according to an embodiment of the present invention.

FIG. 1 is a block diagram of a flash memory device 100 according to the present invention. The flash memory device 100 may program selected memory cells to two different target states simultaneously. That is, the flash memory device 100 may program a part of memory cells of the selected page to a first target state, while programming the rest of the memory cells to a second target state. This will be described below in detail.

A cell array 110 includes memory cells connected to a bitline and a wordline. Particularly, a multi-level cell (MLC) allows multi-bit data to be stored in a single cell. In this regard, the MLC is programmed to have a threshold voltage corresponding to one of program states each corresponding to their multi-bit data. The MLCs are accurately and precisely programmed to accept a program state number $2^k$ corresponding to bit number (k) stored in a restricted threshold voltage window. Hence, the MLC cannot avoid a narrow reading margin between threshold voltage distributions. Following the program operation, a threshold voltage of memory cells may be shifted by program disturbance, charge loss, change of temperature, and so forth. In view of the above characteristics, a program operation for making a precise threshold voltage distribution is a condition that is essentially set to provide reliability of read-out data.

A row decoder 120 typically selects a wordline in response to a row address X-Add. The row decoder 120 transfers various types of wordline voltages from a voltage generator 180 to a selected wordline. During a program operation, the row decoder 120 transfers a program voltage Vpgm (of about 15-20 volt in one exemplary embodiment) and a verify voltage Vvfy to a selected wordline and transfers a pass voltage Vpass to an unselected wordline.

A bitline selecting unit 130 selects even pages or odd pages among a plurality of bitlines. In response to an address, the bitline selecting unit 130 selects even bitlines BLe_0, BLe_1, ..., BLe_n−1 or odd bitlines BLo_0, BLo_1, ..., BLo_n−1 which are arranged alternately. While the above description focused on bitlines BLe_0 and BLo_0 that are alternately selected by the bitline selecting unit 130, the configuration of the bitline selecting unit 130 is not limited to the configuration described. That is, the advantages of the present invention may be equivalently applied to a bitline selection scheme, not the structure where bitlines are alternately selected.

A page buffer block 140 acts as a write driver or a sense amplifier according to an operation mode. For example, the page buffer block 140 acts as a sense amplifier in a read operation mode and as a write driver in a program operation mode. The page buffer block 140 includes a plurality of page buffers 141, 142, ..., 143 to program one page. Each of the page buffers 141, 142, ..., 143 includes two latches, i.e., a main latch and a cache latch. The page buffers 141, 142, ..., 143 each including two latches may enable the page buffer block 140 to program selected memory cells to two different target states. The page buffers 141, 142, ... 143 perform a verify-read operation and a column scanning (Y-scan) operation after programming selected memory cells to two different target states. Therefore, it is not necessary to perform a verify-read operation and a column scan operation for memory cells programmed to a target state of a threshold voltage after completion of the program operation. Although each of the page buffers 141, 142, ..., 143 included in the page buffer block 140 includes two latches, a verify-read operation and a column scan operation for memory cells programmed to a low target state may be skipped.

A column decoder and input/output buffer (a column decoder & I/O buffer) 150 selects selected columns by a predetermined unit (e.g., I/O unit) in response to a column address Y-Add. The column decoder & I/O buffer 150 selects page buffers 141, 142, ..., 143 in response to the column address Y-Add. During a program operation, program data bits provided through the column decoder & I/O buffer 150 are stored in a selected page buffer. During a read operation, data provided from selected page buffers 141, 142, ..., 143 is output to an external destination through the column decoder & I/O buffer 150. Specifically, during a program verifying operation, the column decoder & I/O buffer 150 transmits sensed data to a pass/fail checker 160.

The pass/fail checker 160 determines whether the selected memory cells are successfully programmed, based on the sensing data provided from the column decoder & I/O buffer 150. If a verify-read operation is performed to sense that all sensed data have a threshold voltage higher than a target threshold voltage, the pass/fail checker 160 transfers a pass signal to a control logic 170. On the other hand, if the verify-read operation is performed to determine that even one of the selected memory cells has a threshold voltage lower than the target threshold voltage, the pass/fail checker 160 sends a failure signal to the control logic 170. The pass/fail checker 160 may be comprised of a wired-OR type circuit.

In response to a command CMD, the control logic 170 performs all program operations to program input data to the cell array 110. The control logic 170 controls the bitline selecting unit 130, the page buffer block 140, and the column decoder & I/O buffer 150 such that selected memory cells are simultaneously programmed to two target states by means of the programming method according to the present invention.

The voltage generator 180 generates a program voltage Vpgm, a verify voltage Vvfy, and a pass voltage Vpass in compliance with instructions from the control logic during a program operation.

Figure 2:
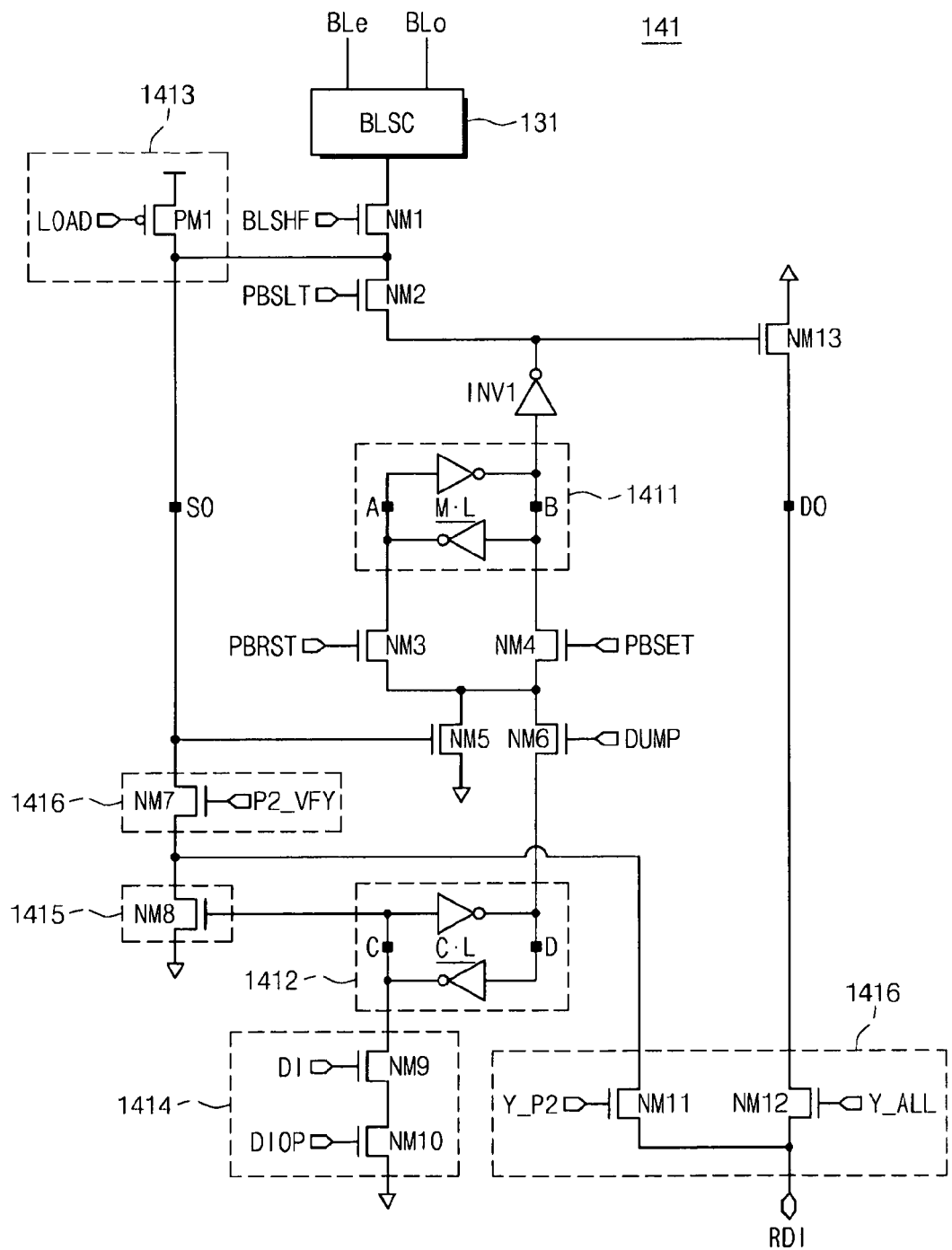
FIG. 2 is a circuit diagram illustrating the configuration of a page buffer according to an embodiment of the present invention.

The flash memory device 100 illustrated in FIG. 2 may simultaneously program memory cells having different target states. Specifically, respective page buffers of the page buffer block 140 have a two-latch structure of a main latch and a cache latch. However, a page buffer may simultaneously program memory cells to two target states through a two-latch structure. Further, a page buffer may selectively perform a verify-read operation and a column scan operation following a program operation. That is, the verify-read operation and the column scan operation may be skipped relative to memory cells corresponding to a state judged as "PASS" of the two target states programmed simultaneously. As a result, a page buffer may be provided to increase programming speed while decreasing the number of latches.

FIG. 2 is a circuit diagram illustrating the configuration of the page buffer 141 shown in FIG. 1. The page buffer 141 may simultaneously program memory cells to two target states using two latches 1411 and 1412. After providing a program voltage Vpgm to simultaneously program memory cells to two target states, the page buffer 141 performs a verify-read operation twice. During a program operation performing using an incremental step pulse programming (ISPP) scheme, the page buffer 141 may skip a verify-read operation and a column scan operation relative to a state judged as "PROGRAM PASS" of the two target states. Hereinafter, this operation will be referred to as a verify skip mode. According to the configuration of the page buffer 141, the page buffer 141 may simultaneously program memory cells to two target states while including two latches and may provide a verify skip mode, which will now be described below in detail.

The two latches 1411 and 1412 write multi-bit data into a memory cell or temporarily latch sensed data from memory cells. The main latch 1411 and the cache latch 1412 each include two inverters. During a program operation, a node B of the main latch 1411 corresponding to a cell to be programmed is set to a high level or logic '1'. However, a node B of the main latch 1411 connected to a program inhibit memory cell is set to a low level or logic '0'.

The cache latch 1412 temporarily latches input data and provides the input data to the main latch 1411 during a dumping operation. During a program operation, another data is input to the cache latch 1412 according to a target state. During a verifying operation, memory cells each corresponding to two target states programmed simultaneously according to the state of the cache latch 1412 are selectively verified.

A load circuit 1413 is coupled between a power supply voltage Vcc and a sensing node SO and includes a load transistor PM1 switched in response to a load signal LOAD. When sensing data of a memory cell, the load circuit 1413 precharges the sensing node SO. When initializing the cache latch 1412, the load circuit 1413 precharges the sensing node SO to turn on a transistor NM5. Thereafter, in response to activation of a dump signal DUMP, the transistor NM6 is turned on and a node D of the cache latch 1412 is grounded.

An input circuit 1414 inputs data to be programmed to the cache latch 1412 after initialization of the cache latch 1412. When the cache latch 1412 receives input data ID and data input signal DIOP, a node C of the cache latch 1412 is grounded or maintained at the initial state.

A ground circuit 1415 supports a selective read verifying operation for memory cells programmed to two target states P2 and P3. The ground circuit 1415 discharges a precharge sensing node SO or maintains the same at a precharge state to selectively sense memory cells programmed to the target state P2 among the program cells programmed to the target states P2 and P3. The ground circuit 1415 is comprised of a ground transistor NM8. The cache latch 1412 corresponding to the memory cells programmed to the target state P2 has a logic state (C:0, D:1). On the other hand, the cache latch 1412 corresponding to the memory cells programmed to the target state P3 has a logic state (C:1, D:0). Thus, the cache latch 1412 corresponding to the memory cells programmed to the target state P3 maintains the ground transistor NM8 at a turn-on state. A verify control signal P2_VFY is activated during a verify-read operation of the memory cell programmed to the target state P2. In this case, a transistor NM7 and the ground transistor NM8 are simultaneously turned on at a page buffer connected to memory cells programmed to a target state P3. In addition, a sensing node S0 is discharged to block a verify-read operation for the memory cells programmed to the target state P3. However, the ground transistor NM8 is turned off during a verify-read operation for the memory cells programmed to the target state P2. As transistors NM4 and NM5 are turned on, a node B of the main latch 1411 is set based on the state of the sensing node S0. The ground circuit 1415 blocks a column scan operation for the memory cells programmed to the target state P3 during a column scan operation for the memory cells programmed to the target state P2. That is, the ground transistor NM8 is turned off during the column scan operation for the memory cells programmed to the target state P2. When scan control signals Y_P2 and Y-ALL are activated, charges precharged to an output node D0 are discharged via the ground transistor NM8. Column scanning of a page buffer performing a program operation to the target state P3 may be blocked during the column scan operation for the memory cells programmed to the target state P2. The ground transistor NM8 provides a ground source during the verify-read operation and the column scan operation for the memory cells programmed to the target state P2.

A verify circuit 1416 performs a selective verify-read operation and a selective column scan operation relative to the two target states P2 and P3. The transistor NM7 selects a verify-read operation for the memory cells programmed to the target state P2 in response to a verify control signal P2_VFY. That is, when the verify control signal P2_VFY is activated, the verify-read operation for the memory cells programmed to the target state P2 is activated while blocking the verify-read operation relative to the target state P3. These operations may be performed because the ground circuit 1415 is switched with reference to the logic state of the cache latch 1412. Transistors NM11 and NM12 of the verify circuit 1416 perform a selective column scan operation relative to the two target states P2 and P3. That is, the scan control signals Y_P2 and Y-ALL are activated during the column scan operation for the memory cells programmed to the target state P2. The transistors NM11 and NM12 are turned on to transfer a voltage of the output node D0 corresponding to verify data stored in the main latch 1411 to an output terminal RDI. However, at this time, the output node D0 is discharged because the cache latch 1412 corresponding to the memory cells programmed to the target state P3 is maintained at the turned-on state. In that the memory cells programmed to the target state P3 must indicate "PROGRAM PASS", the output node D0 corresponding to the memory cells programmed to the target state P3 must not be maintained at a precharge state. That is, it is possible to perform a selective column scan operation relative to the target state P2. During the column scan operation for the memory cells programmed to the target state P3, only the scan control signal Y-ALL is activated and only the transistor NM12 is turned on. The verify circuit 1416 may selectively perform a verify-read operation and a column scan operation relative to the target state P2 with reference to a value of the cache latch 1412. Thus, a circuit may be provided for sharing one ground transistor NM8 during a verify-read operation and a column scan operation. Moreover, a verifying operation (a verify-read operation and a column scan operation) for the memory cells programmed to the target state P2 may be skipped through deactivation of the verify control signal P2_VFY and the scan control signal Y_P2. The above configuration makes it possible to skip a verifying operation without additional latches.

The above-described page buffer 141 may program memory cells selected to two target states at the same time by means of two latches 1411 and 1412. In addition, the page buffer 141 may perform a verify skip mode operation by means of the ground circuit 1415 and the verify circuit 1416. According to the verify skip mode operation, it is possible to skip a verify-read operation and a column scan operation relative to a program-completed target state among a plurality of simultaneously-programmed target states. The ground transistor NM8 of the ground circuit 1415 may be commonly used during the verify-read operation and the column scan operation.

Figure 3:
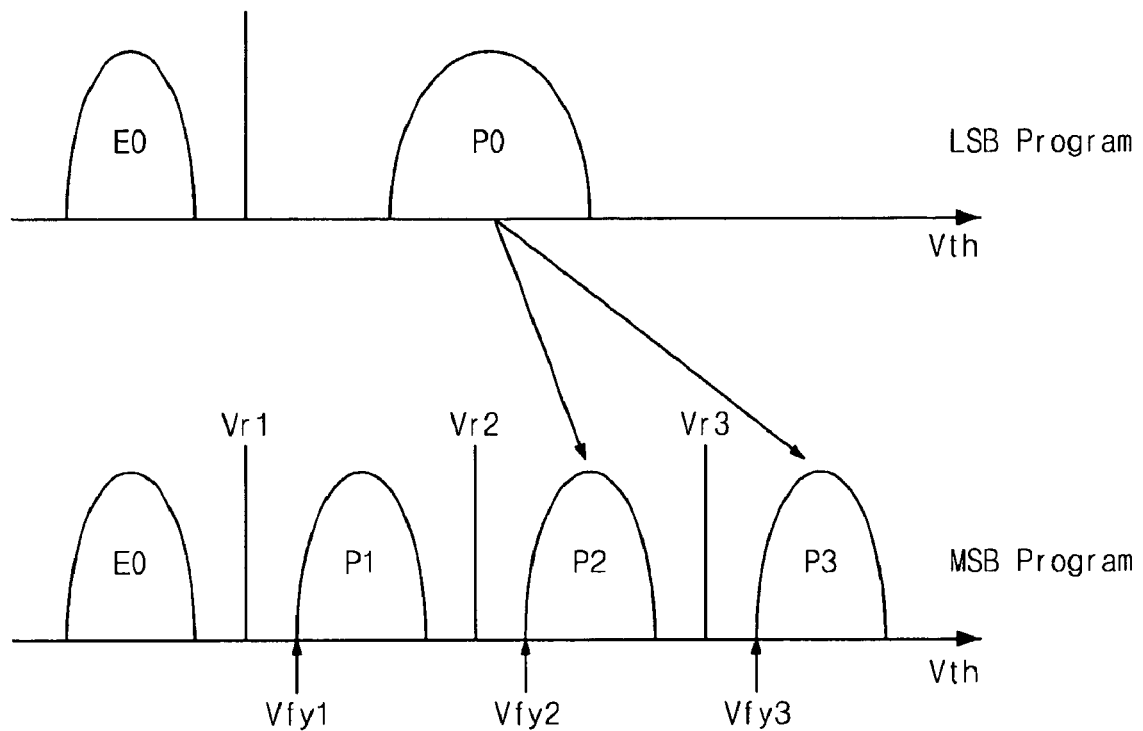
FIG. 3 illustrates threshold voltage distributions of memory cells that are simultaneously programmed to two target states.

FIG. 3 illustrates a simultaneous program operation relative to two target states P2 and P3 which may be performed by means of the page buffer configuration shown in FIG. 2. Referring to FIG. 3, a page buffer block 140 according to the present invention may be configured to perform a simultaneous program operation from a program state P0 of memory cells formed with programming of an LSB page to program target states P2 and P3 while programming an MSB page.

Threshold voltage states P1, P2, and P3 of the memory cells formed with programming of the LSB page are verified by verify-read voltages Vfy1, Vfy2, and Vfy3, respectively. Also these threshold voltage states P1, P2, and P3 are read out by read voltages Vr1, Vr2, and Vr3, respectively.

Figure 4:
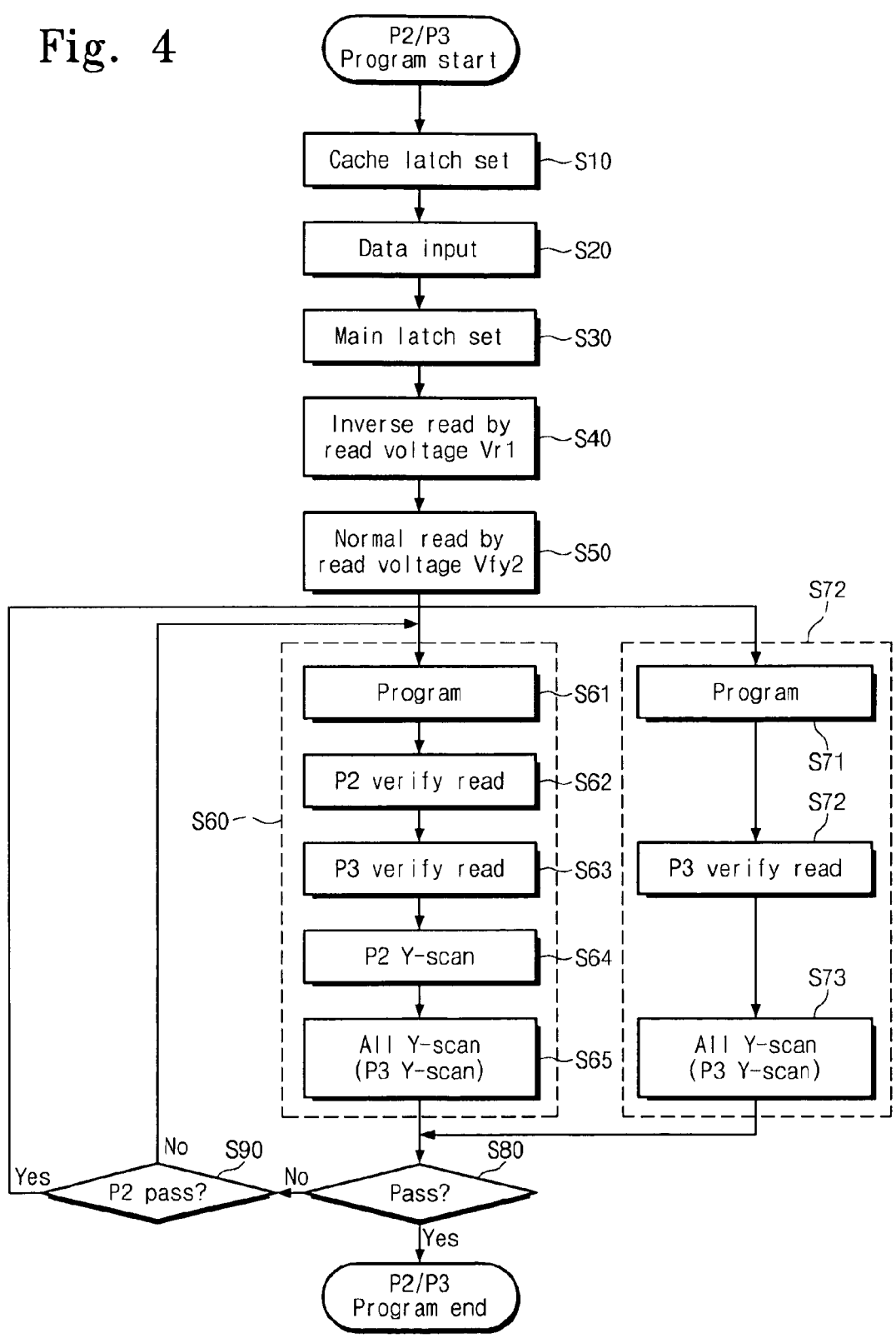
FIG. 4 is a flowchart illustrating a programming method according to an embodiment of the present invention.

FIG. 4 is a flowchart illustrating a programming procedure of an embodiment of the present invention. In FIG. 4, a programming procedure to two target states P2 and P3 during a program operation is illustrated. Particularly, based on a result of verifying memory cells programmed to the target state P2 corresponding to a low threshold voltage among the two target states P2 and P3, it is determined whether a verify skip mode is performed in a subsequent program loop. The programming procedure of the present invention will be described below in detail with reference to the above-described elements shown in FIG. 2.

When programming an LSB page is completed, a simultaneous programming procedure to the target states P2 and P3 is started. A cache latch 1412 is initialized, being set to have a state (C:1, D:0). For the initialization of the latch 1412, a sensing node S0 is precharged to turn on a transistor NM5 and activate a dump signal DUMP. As a result, a transistor NM6 is turned on to initialize the cache latch 1412. That is, a node D of the cache latch 1412 is grounded to initialize the cache 1412 (S10).

Following the initialization of the cache latch 1412, MSB page data is input to the initialized cache latch 1412. Input data and an input control signal DIOP are provided to load input data to the cache latch 1412. For example, the cache latch of a page buffer programming memory cells to the target states P1 and P2 is set to have a state (C:0, D:1) due to the input data. A cache latch 1412 corresponding to memory cells to be programmed to target states E0 and P3 is set to have a state (C:1, D:0) (S20).

After the program data corresponding the MSG page is input, initialization of a main latch 1411 is done. For the initialization of the main latch 1411, the sensing node S0 is precharged to turn on the transistor NM5 and a set signal PBSET is activated to turn on a transistor NM4. With the initialization of the main latch 1411, the main latch 1411 is set to have a state (A:1, B:0) (S30).

Following the initialization of the main latch 1411, an inverse read operation is performed to sense a program state of an LSB page. During the inverse read operation, the sensing node S0 is connected to a bitline of a selected memory cell and precharged to sense a program state of the memory cell. According to the sensing result, the sensing node S0 is maintained at the precharge state or discharged to turn on or turn off the transistor NM5. At this point, if a reset signal PBRST is activated to ground a node A, the main latch 1411 is inverted from the initial state (A:1, B:0) or maintained at the initial state (A:1, B:0). Through the inverse read operation, memory cells programmed to the target states P2 and P3 are selected (S40).

There may be memory cells programmed in advance to be higher than a verify voltage Vfy2, among the memory cells to be programmed to the target state P2. Accordingly, a normal read operation is performed to select these memory cells and set the selected memory cells to a program-inhibit state. For the normal read operation, a load signal LOAD is activated and the sensing node S0 is precharged. After connecting the bitline of the selected memory cell to the sensing node S0, the program state of the memory cell is sensed. According to the sensing result, the sensing node S0 is maintained at the precharge state or discharged. According to the level of the sensing node S0, the transistor NM5 is turned on or turned off. At this point, if a set signal PBSET is activated, the main latch 1411 is inverted from the initial state (A:1, B:0) or maintained at the initial state (A:1, B:0). In case of memory cells programmed in advance to be higher than the verify voltage Vfy2, the sensing node S0 is maintained at the precharge state and thus the transistor NM5 is turned on to invert the main latch 1411 from the initial state (A:1, B:0). With the inversion of the main latch 1411, the memory cells programmed in advance to be higher than the verify voltage Vfy2 are program-inhibited (S50).

According to the main latch 1411 and the cache latch 1412 which are set during the foregoing steps, the selected memory cells are programmed. That is, the memory cells to be programmed to the target states P2 and P3 are simultaneously programmed by the same program voltage (S61).

Following the application of the program voltage, a verify-read operation is performed for memory cells corresponding to the target state P2. This verify-read operation includes activating control signals BLSHF and P2_VFY and precharging the sensing node S0. However, in a page buffer of memory cells programmed to a target state P3 corresponding to a logic state (C:1, D:0) of the cache latch 1412, a ground transistor NM8 is turned on and the sensing node S0 is discharged. Thus, the verify-read operation is activated only in the page buffer programmed to the target state P2. If a threshold voltage of a selected memory cell is programmed to be higher than the verify voltage Vfy2, the transistor NM5 is turned on by a precharge voltage of the sensing node S0 and a node B is grounded, inverting the main latch 1411 to a state (A:1, B:0). On the other hand, when the threshold voltage of the selected memory cell is lower than the threshold voltage Vfy2, the precharge voltage of the sensing node S0 is discharged through a bitline, maintaining the main latch 1411 at the state (A:0, B:1) (S62).

Following the selective verify-read operation for the memory cells programmed to the target state P2, a verify-read operation is performed for memory cells programmed to the target state P3. During the read-verify operation for the memory cells programmed to the target state P3, the sensing node S0 is precharged while the control signal BLSHF and the set signal PBSET are activated. Since it is not necessary to refer to the state of the cache latch 1412 during the read-verify operation for the memory cells programmed to the target state P3, a control signal P2_VFY is deactivated. The other bias conditions are identical to those of the verify-read operation for the memory cells programmed to the target state P2 (S63).

Following the sequential verify-read operations for the memory cells programmed to the target states P2 and P3, a column scan (Y-Scan) operation is performed for the memory cells programmed to the target states P2 and P3. The column scan (Y-Scan) operation starts from page buffers programming the memory cell to the target state P2. That is, during the column scan (Y-Scan) operation, an output node D0 of the page buffer is precharged and it is determined whether a logic value of the output node N0 is maintained at '1' or discharged to '0' according to the state of the main latch 1411. In case of the memory cells programmed to the target state P2, the main latch 1411 of the page buffer has a state (A:1, B:0). Thus, a value of the node B is inverted by an inverter INV1. As a result, a transistor NM13 is turned on to discharge the precharged output node D0 and to activate scan control signals Y-P2 and Y-ALL. At this point, the value of the cache latch 1412 is referred to. A ground transistor NM8 of the page buffer corresponding to the memory cells corresponding to the target state P2 is turned off. However, a ground transistor NM8 of the page buffer corresponding to the memory cells corresponding to the target states E0, P1, and P3 is turned on to discharge the output node D0 to a logic '0' (S64).

Following the column scan operation for the verify-read result of the memory cells programmed to the target state P2, a column scan operation is performed for a verify-read result of the memory cells programmed to the target state P3. Except that only a scan control signal Y_P2 is deactivated, the column scan operation for the verify-read result of the memory cells programmed to the target state P3 is identical to the column scan operation for the verify-read operation of the memory cells programmed to the target state P2. That is, during the column scan operation, the output node D0 is precharged and it is detected whether a logic value of the output node is maintained at '1' or discharged to '0' according to the state of the main latch 1411. In case of the memory cells programmed to the target state P3, the main latch 1411 of the page buffer has a state (A:0, B:1). Thus, a value of the node B is inverted by the inverter INV1 and a transistor NM13 is turned on. As a result, the precharged output node D0 is discharged and the scan control signals Y-ALL is activated (S65).

When the column scan operation is completed, it is determined, based on the result of the column scan operation, whether the memory cells are programmed to the two target states P2 and P3. That is, it is determined whether the memory cells are successfully programmed (S80). If the programmed memory cells are all judged to be "PROGRAM PASS", the program procedure for the two target states P2 and P3 is completed. On the other hand, if the programmed memory cells are all judged to be "PROGRAM FAIL", this routine proceeds to a reprogram step (S90).

In the step S90, either one of a preprogram operation of a verify skip mode and a typical reprogram operation is selected based on the column scan result of the memory cells programmed to the target state P2. If the memory cells programmed to the target state P2 are judged to be "PROGRAM FAIL", this routine proceeds to a program and verify step (S60) in which a verify-read operation is performed for the two target states P2 and P3. On the other hand, if the memory cells programmed to the target state P2 are judged to be "PROGRAM PASS", this routine proceeds to a program and verify step (S70) in which a verify-read operation and a column scan operation for the target state P2 is skipped.

The step S60 includes a simultaneous program step S61 for the above-described two target states P2 and P3, verify-read steps S62 and S63 for the respective target states P2 and P3, and column scan steps S64 and S65 for the respective target states P2 and P3. In a step S70, a verify-read operation and a column scan operation for the target state P3 is skipped. That is, the step S70 includes a program step S71 in which a program voltage is applied to selected memory cells, a verify-read step S72 for the target state P3, and a column scan step S73 for the verify-read result.

According to the above-described program procedure, although memory cells selected to the two target states P2 and P3 are simultaneously programmed, a verify-read operation and a column scan operation for a target state programmed in advance are skipped to improve a program speed.

Figure 5A:
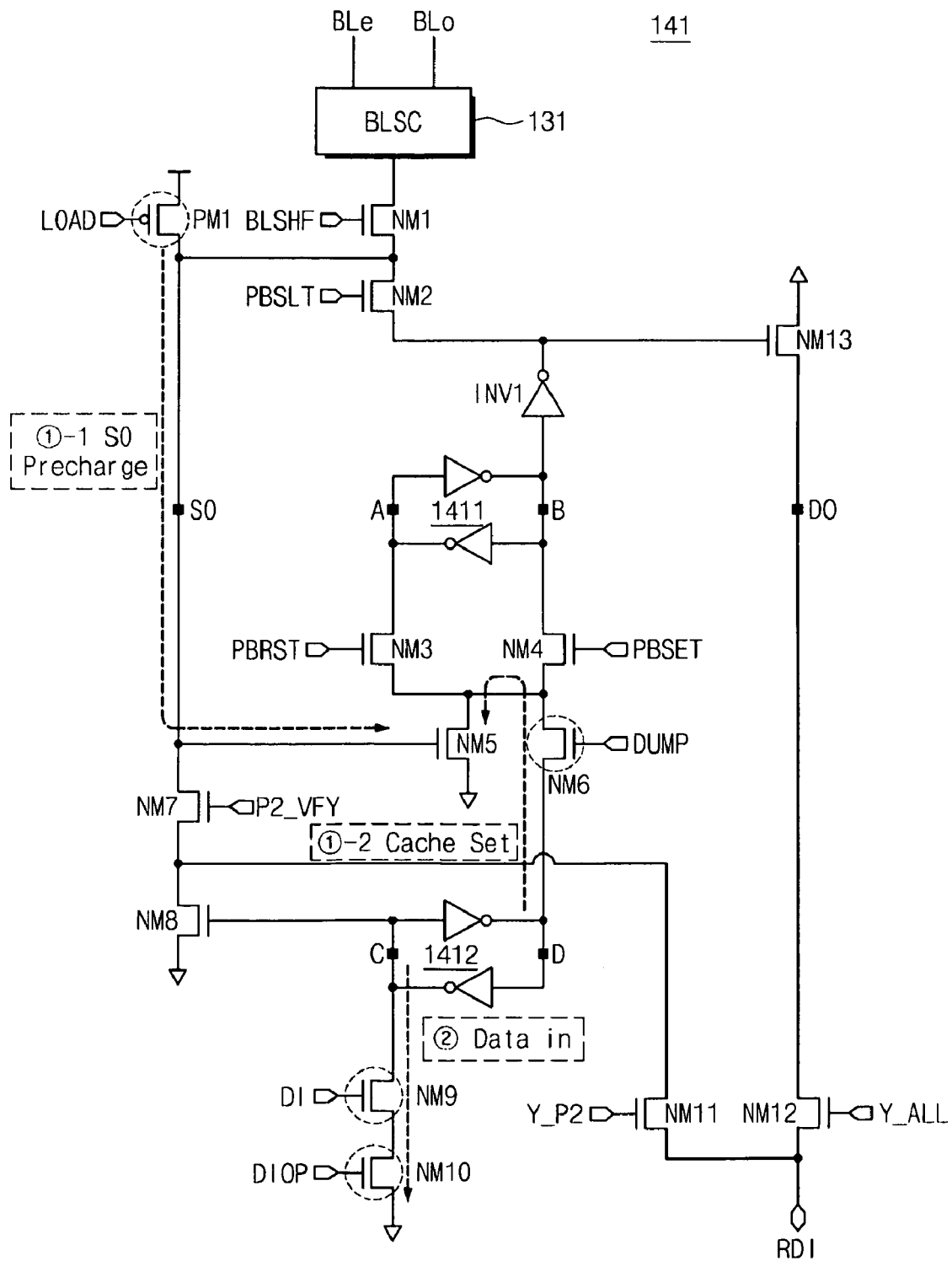
FIG. 5A is a circuit diagram illustrating a setting operation of a cache latch according to an embodiment of the present invention.

FIGS. 5A and 5B show operation conditions in the initialization step S10 and the data input step S20 of the cache latch 1142, among the foregoing steps shown in FIG. 4. Referring to FIG. 5A, an operation of initializing the cache latch 1412 and an operation of inputting data to the cache latch 1412 are shown on signal paths ①-1, ①-2, and ②.

First, the sensing node S0 is precharged to initialize the cache latch 1412. For precharging the sensing node S0, a load signal LOAD is activated to a low level. Accordingly, a load transistor PM1 is turned on and the sensing node S0 is precharged to a level of a power supply voltage Vcc, which is shown on the signal path ①-1. If a transistor NM5 is turned on as the sensing node is precharged and a dump signal DUMP is activated to turn on a transistor NM6, a node D of the cache latch 1412 is grounded as shown on the signal path ①-2. Thus, the cache latch 1412 is initialized to a logic state (C:1, D:0).

Following the initialization of the cache latch 1412, data corresponding to an MSB page is input to the cache latch 1412. As input data D1 is provided and an input control signal DIOP is activated, a logic value of a node C of the cache latch 1412 is maintained at an initial state or inverted from the initial state. For example, a cache latch 1412 of memory cells to be programmed to target states P1 and P2 corresponding to a logic '0' of an MSB page data is set to a logic state (C:0, D:1). And a cache latch 1412 of memory cells to be programmed to target states E0 and P3 corresponding to a logic '1' of an MSB data bit is set to have a logic state (C:1, D:0). The data input operation is briefly shown on the signal path ②.

The initialization of the cache latch 1412 and a state following the data input are briefly shown in FIG. 5B. As the MSB page is input, a node C of the cache latch 1412 is set to the logic '1' in case of the target states E0 and P3. On the other hand, the node C of the cache latch 1412 is set to the logic '0' to program a memory cell to the target states P1 and P2. The node D corresponds to a complementary value of the node C.

Figure 6A:
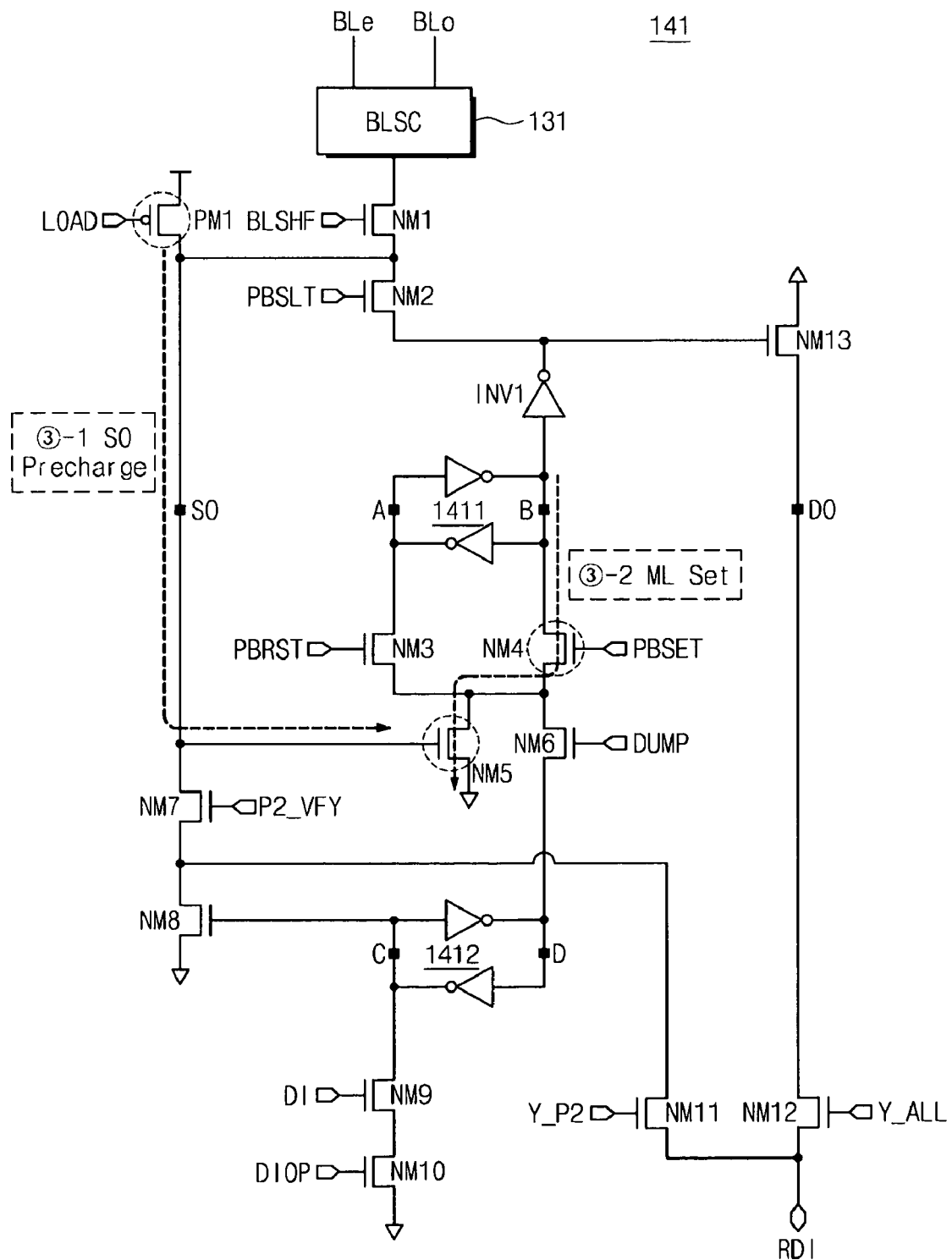
FIG. 6A is a circuit diagram illustrating an initializing operation of a main latch according to an embodiment of the present invention.

FIG. 6A is a circuit diagram illustrating an operation of initializing the main latch 1411 after setting the cache latch 1412. The sensing node S0 is precharged to initialize the main latch 1411. The load signal LOAD is activated to a low level to precharge the sensing node S0. Accordingly, the load transistor PM1 is turned on and the sensing node S0 is precharged to a level of a power supply voltage Vcc. The precharge operation of the sensing node S0 is shown on a signal path ③-1. As the sensing node S0 is precharged, the transistor NM5 is turned on. As a set signal PBSET is activated, a node B of the main latch 1411 is grounded as shown on a signal path ③-2. Thus, the main latch 1411 is set to a logic state (A:1, B:0) by the initialization operation.

FIG. 6B is a table illustrating data states after the main latch 1411 and the cache latch 1412 are initialized and data is input thereto. Referring to FIG. 6B, a state of the cache latch 1412 is identical to the table value shown in FIG. 5B. However, a state of the main latch 1411 is initialized to a logic state (A:1, B:0) which is a program inhibit state.

Figure 7A:
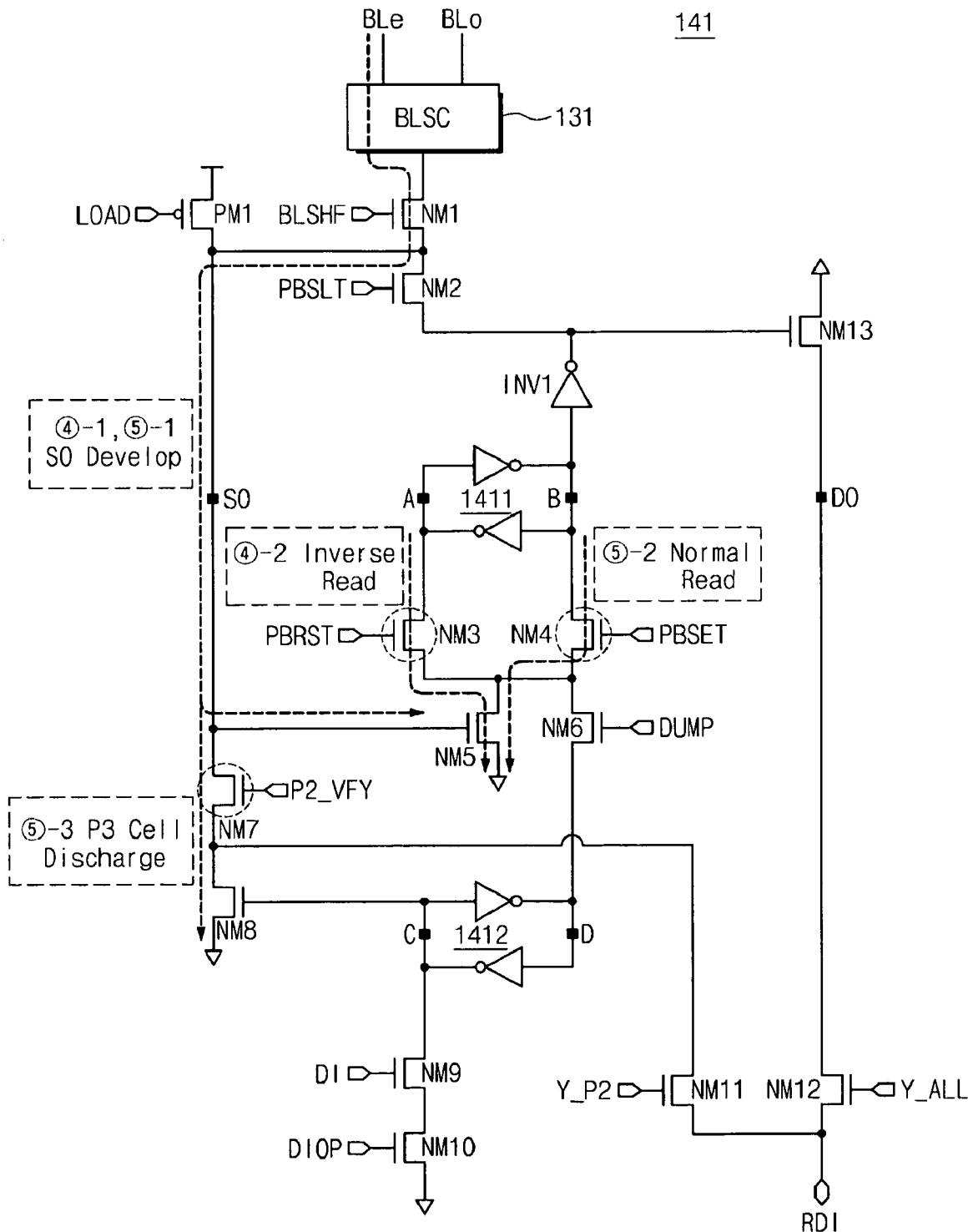
FIG. 7A is a circuit diagram illustrating an inverse read operation and a normal read operation according to an embodiment of the present invention.

FIG. 7A illustrates inverse read and normal read operations for storing LSB page data in the main latch 1411. The inverse read and normal read operations are often called an initial read operation. Through the inverse read operation using a read voltage Vr1, LSB page data programmed to memory cells is stored in the main latch 1411. When a threshold voltage of a memory cell is laid at a program state (P0 in FIG. 3), the memory cell is programmed to a program state P2 or P3 while an MSB page is programmed. However, the memory cells having a threshold voltage corresponding to an erased state E0 must be program-inhibited according to the inverse read operation. That is, the main latch 1411 must be maintained at the initial state (A:1, B:0). Through the normal read operation using a read voltage Vfy2, the memory cells previously having a threshold voltage overlapping the target state P2 are program-inhibited. The inverse read and normal read operations will now be described below in detail.

The inverse read operation may be divided into a step of developing a sensing node and a bitline and a step of setting the main latch 1411. A bitline BLe of a memory cell, which is selected for the inverse read operation, is connected to the sensing node S0. A load transistor PM1 is activated to precharge the sensing node S0 and the bitline BLe. The precharged sensing node S0 is maintained at the precharge state or discharged according to a program state of a memory cell. That is, charges precharged to the sensing node S0 is developed according to the state of the memory cell, which is shown on a signal path ④-1. The transistor NM5 is switched according to the develop state of the sensing node S0. That is, when a threshold voltage of a memory cell is laid at the program state P0, the memory cell turns to an "OFF" cell. Accordingly, the sensing node S0 is maintained at the precharge state and the transistor NM5 is turned on. If the reset signal PBRST is activated, a node A of the main latch 1411 is grounded and set to a logic '0', which is shown on a signal path ④-2. On the other hand, the threshold voltage of the memory cell is laid at the erased state E0, the memory cells turns to an "ON" cell, the sensing node is discharged, and the transistor NM5 is turned off. Although the set signal PBRST is activated, the node A of the main latch 1411 is maintained at the initial state, i.e., logic '1'. Through the inverse read operation, the memory cells laid at the program state P0 by programming the LSB page are selected to be programmed to the two target states P2 and P3. The memory cells programmed to the program state P0 are programmed to the target states P2 and P3 by programming the MSB page. Among the memory cells programmed to the program state P0, there are memory cells previously having a target threshold voltage due to the program operation of the LSB page. A normal read operation is performed by the verify-read voltage Vfy2 such that the memory cells previously having a target threshold voltage are set to a program-inhibit state.

The normal read operation may be divided into a step of developing the sensing node S0 and a bitline and a step of setting the main latch 1411. The verify-read voltage Vfy2 is provided to a wordline of a memory cell selected to perform the normal read operation. The bitline BLe and the sensing node S0 are connected to each other. When the load transistor PM1 is activated, the sensing node S0 and the bitline BLe are precharged. The precharged sensing node S0 is maintained at the precharge state or discharged. That is, charges precharged to the sensing node S0 are developed according to the state of a memory cell, which is shown on a signal path ⑤-1. The transistor NM5 is switched according to the develop state of the sensing node S0. That is, when a threshold voltage of the memory cell is higher than the verify-read voltage Vfy2, the memory cell turns to an "OFF" cell. Accordingly, the sensing node S0 is maintained at the precharge state and the transistor NM5 is turned on. If the set signal PBSET is activated, a transistor NM4 is turned on and the node B of the main latch 1411 is grounded and set to a logic '0'. This setting procedure of the main latch 1411 is shown on a signal path ⑤-2. On the other hand, a normal read operation of memory cells to be programmed to the target state P3 is blocked by referring to the state of the cache latch 1412. That is, if a verify control signal P2_VFY is activated, only the result of developing the program cells to be programmed to the target state P2 is applied to the transistor NM5. That is, the sensing node S0 of the memory cells to be programmed to the target state P3 is discharged by turn-on of a ground transistor NM8 included in a ground circuit (1415 in FIG. 2), which is shown on a signal path ⑤-3. Accordingly, the normal read operation may inhibit programming of memory cells having a threshold voltage higher than the verify-read voltage P2_VFY among the memory cells to be programmed to the target state P2.

Figures 7B, 7C:
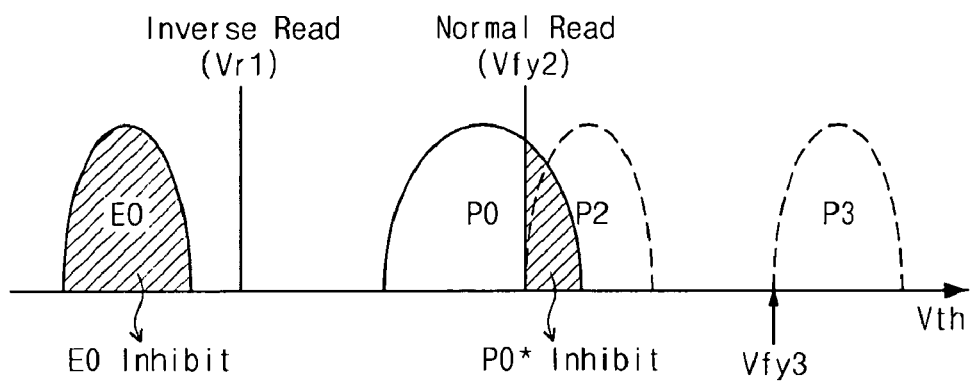
FIG. 7B illustrates a selecting operation based on the inverse read operation and the normal read operation.
FIG. 7C is a table illustrating states of the main latch based on the inverse read operation and the normal read operation according to an embodiment of the present invention.

FIG. 7B is a threshold voltage distribution graph illustrating memory cells that are program-inhibited by an inverse read operation and a normal read operation. Referring to FIG. 7B, memory cells corresponding to a current program state P0 are selected to be programmed to target states P2 and P3 by an inverse read operation using a read voltage Vr1 while an MSB page is programmed. Thus, a main latch 1411 of the memory cells to be programmed to the target state is prepared through the inverse read operation. Among the memory cells laid in the program state P0, memory cells laid in a program state P0 where a threshold voltage is higher than the verify-read voltage Vfy2 are selected to be set to a program inhibit state by the normal read operation. A value of the main latch 1411 of the memory cells laid in the current program state P0 is set to a program inhibit state. Accordingly, through the normal read operation, memory cells whose threshold voltage is previously shifted to a target state are set to the program inhibit state, among the memory cells to be programmed to the target states P2 and P3.

FIG. 7C is a table illustrating a state of the main latch 1411 according to the inverse read and normal read operations. The main latch 1411 is set such that memory cells laid in the program state P0 is activated by the inverse read operation while the MSB page is programmed. That is, the main latch 1411 is set to a logic state (A:0, B:1) by the inverse read operation, preparing a main latch 1411 of memory cells to be programmed to the target states P2 and P3. Among memory cells laid in a program state P0, memory cells laid in a program state P0 where a threshold voltage is higher than a verify-read voltage are selected to be program-inhibited by the normal read operation. That is, a node A of the main latch 1411 of the memory cells laid in the current program state P0 is set to logic '1' to be program-inhibited.

As previously described with reference to the flowchart in FIG. 3, a simultaneous program operation to the two target states P2 and P3 is performed for selected memory cells based on setting the latch of the page buffer 141. That is, a bitline is setup to an inverted value of a node B of the main latch 1411 and a program voltage Vpgm is applied to a wordline. Following the program voltage corresponding to one pulse, a verify-read operation and a column scan operation are sequentially performed for the respective target states P2 and P3.

Figure 8:
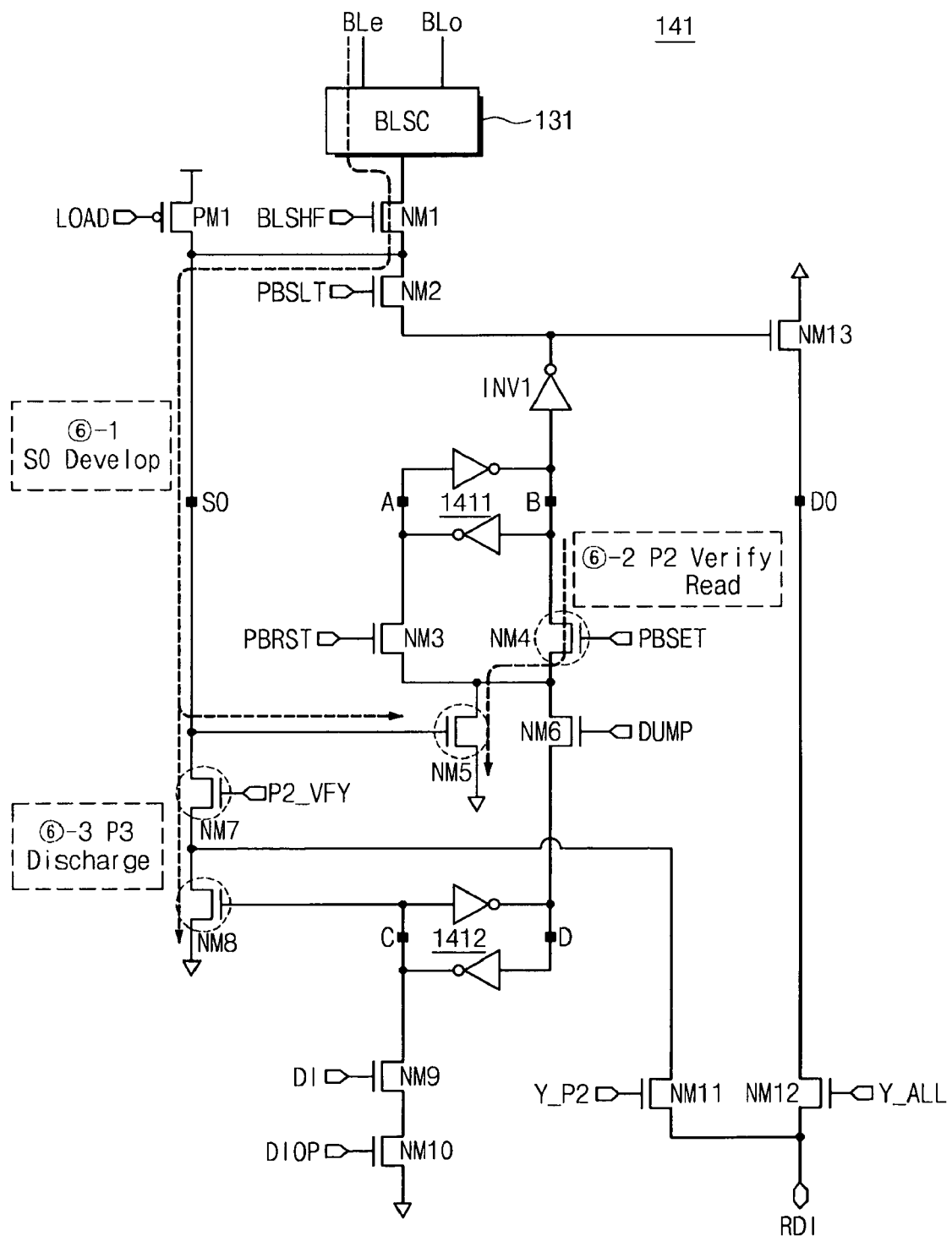
FIG. 8 is a circuit diagram illustrating a selective read operation for memory cells programmed to a target state (P2) according to an embodiment of the present invention.

FIG. 8 is a circuit diagram illustrating the verify-read operation for the memory cells programmed to the target state P2 described at the step S62 in FIG. 3. A selective verify-read operation for the memory cells programmed to the target state P2, among the memory cells programmed to the two target states P2 and P3, will now be described with reference to FIG. 8. First, a verify-read voltage Vfy2 is provided to a wordline of selected memory cells. A bitline BLe and a sensing node S0 are connected to each other. A load transistor PM1 is activated, and the sensing node S0 and the bitline BLe are precharged. The precharged sensing node S0 is maintained at the precharge state or discharged according to the state of a memory cell. That is, charges precharged to the sensing node S0 are developed according to the state of a memory cell, which is shown on a signal path ⑥-1. A verify control signal P2_VFY for referring to data of the cache latch 1412 is activated to perform the selective verify-read operation. In this case, cache latches 1412 of a page buffer 141 for programming selected memory cells to the target state P3 turn on a ground transistor PM8. Thus, the sensing node S0 is discharged and a transistor NM5 is turned off to block a verify-read operation for the target state P3, which is shown on a signal path ⑥-3.

A logic state of a node B of the main latch 1411 is set according to the selective verify-read operation for the cells programmed to the target state P2. That is, the transistor NM5 is switched according to the develop state of the sensing node S0. When a threshold voltage of a memory cell is higher than a verify-read voltage Vfy2, the memory cell turns to an "OFF" cell. Accordingly, the sensing node S0 is maintained at the precharge state and the transistor NM5 is turned on. If the set signal PBSET is activated, a transistor NM4 is turned on and a node B of the main latch 1411 is grounded and set to logic '0'. This setting procedure of the main latch 1411 is shown on a signal path ⑥-2. If programming a memory cell to the target state P2 is not completed, the memory cell turns to an "ON" cell because a threshold voltage of the memory cell is lower than the verify-read voltage Vfy2. The sensing node S0 is discharged through a bitline, and the transistor NM5 is turned off. As a result, the main latch 1411 is maintained at the previous logic state (A:0, B:1).

Figure 9:
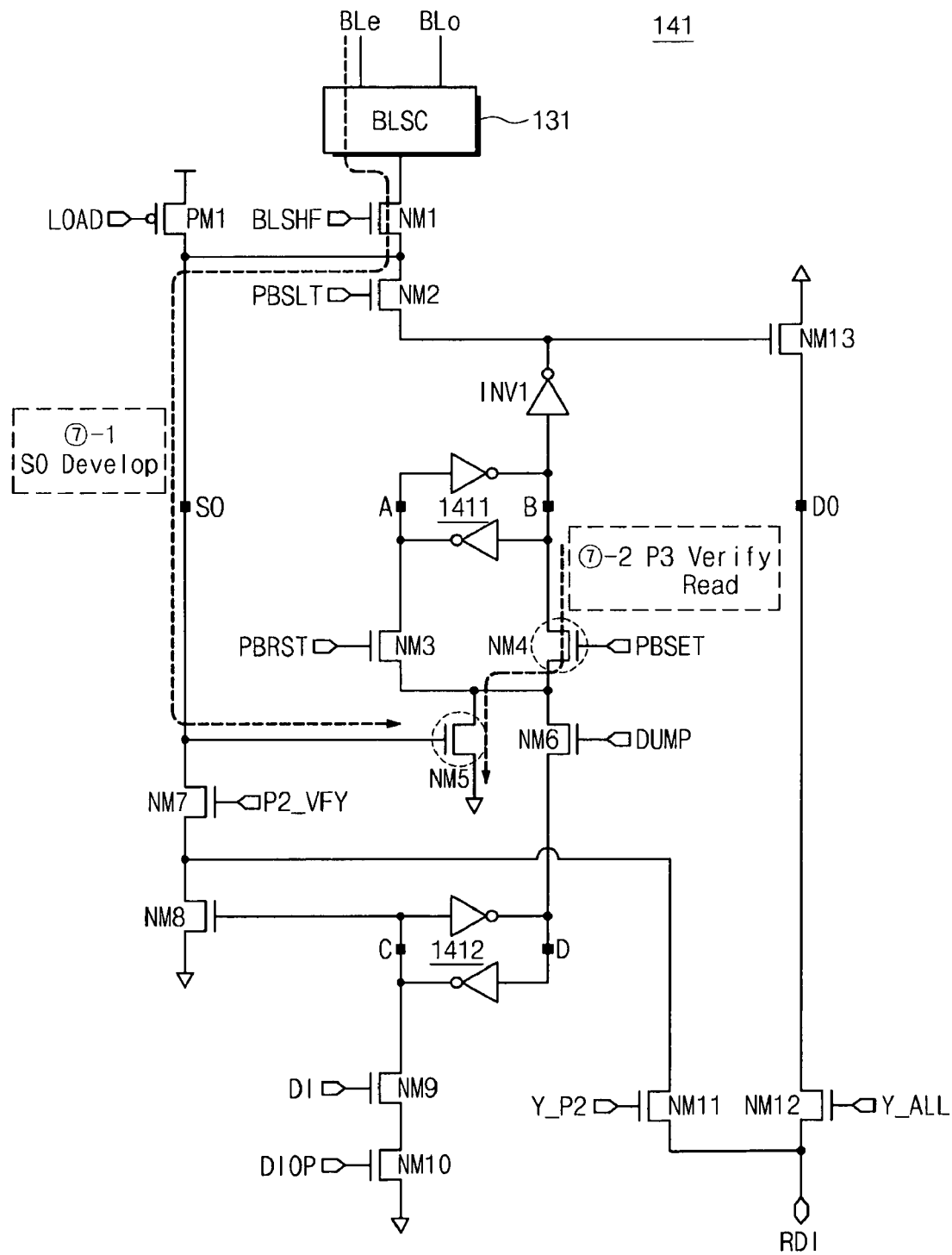
FIG. 9 is a circuit diagram illustrating a selective verifying operation for memory cells programmed to a target state (P3) according to an embodiment of the present invention.

FIG. 9 is a circuit diagram illustrating the verify-read operation for the memory cells programmed to the target state P3 described at the step S63 in FIG. 3. Following the selective verify-read operation for the memory cells programmed to the target state P2, a verify-read operation is performed for the memory cells programmed to the target state P3 under a verify-read voltage Vfy3. The bitline BLe and the sensing node S0 are connected to each other. The load transistor PM1 is activated to precharge the sensing node S0 and the bitline BLe. At the timing when a verify-read voltage Vfy3 is provided to a wordline, the precharged sensing node S0 is maintained at the precharge state or discharged according to the state of the memory cell. That is, charges precharged to the sensing node S0 are developed according to the state of the memory cell, which is shown on a signal path ⑦-1. Since a verify control signal P2_VFY is deactivated during the verify-read operation for the memory cells programmed to the target state P3, a value of the cache latch 1412 is not referred to. Therefore, the transistor NM5 is switched according to the develop state of the sensing node S0. When a threshold voltage of the memory cell is higher than a verify-read voltage, the sensing node S0 is maintained at the precharge state to turn on the transistor NM5. If the set signal PBSET is activated, a transistor N4 is turned on and a node B of the main latch 1411 is grounded to be set to logic '0'. This setting procedure of the main latch 1411 is shown on a signal path ⑦-2. If programming the memory cell to the target state P3 is not completed, the memory cell turns to an "ON" cell because a threshold voltage of the memory cell is lower than the verify-read voltage Vfy3. The sensing node is discharged through a bitline, and the transistor NM5 is turned off. At this point, the main latch 1411 is maintained at the previous logic state (A:0, B:1).

Figure 10:
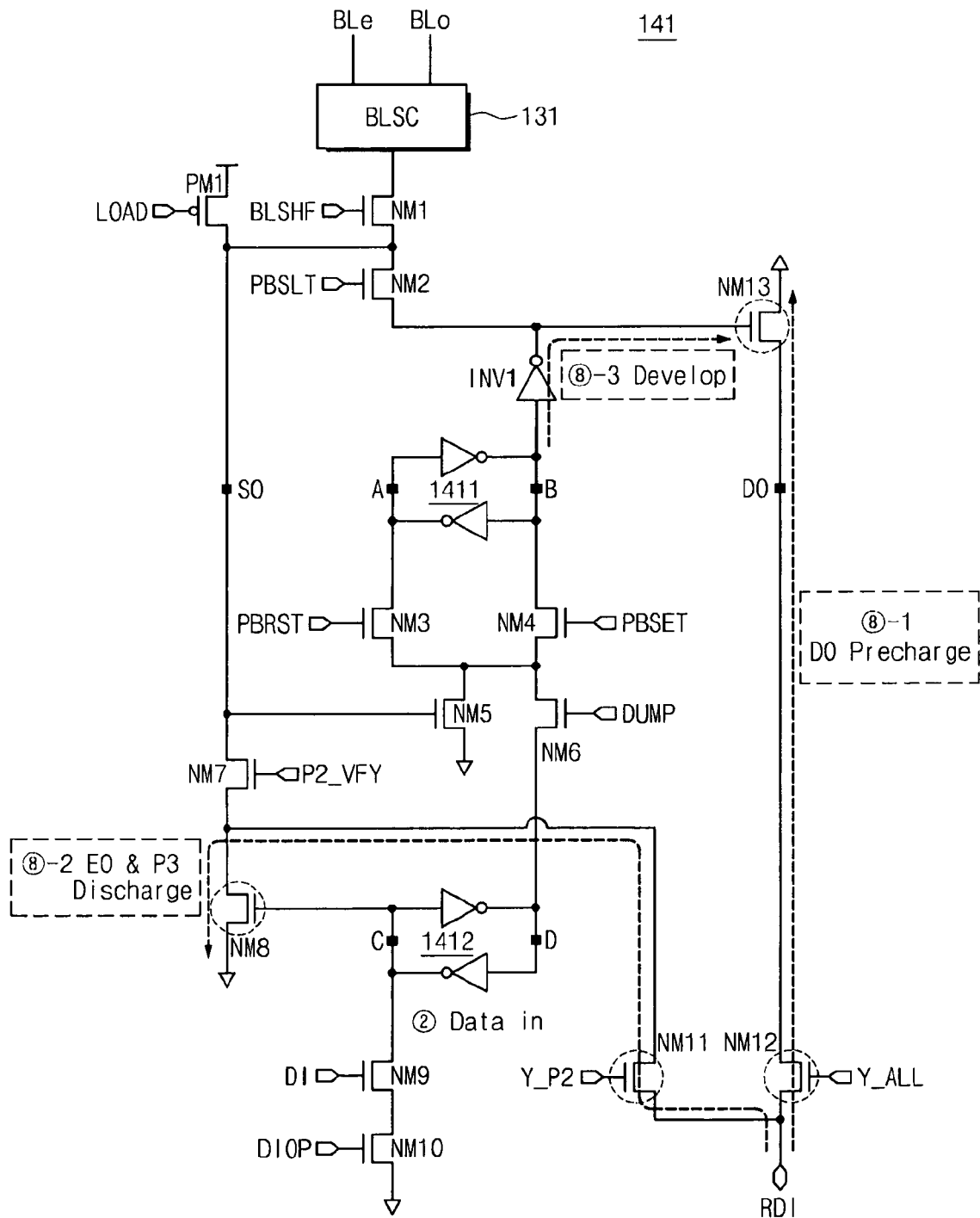
FIG. 10 is a circuit diagram illustrating a column scan operation for the memory cells programmed to the target state (P2).

FIG. 10 is a circuit diagram illustrating a column scan operation for outputting the verify-read result of the memory cells programmed to the target state P2. According to the selective verify-read operation for the memory cells programmed to the target state P2, which is previously described in FIG. 8, data is latched to the main latch 1411. When memory cells are normally programmed to the target state P2 (i.e., "PROGRAM PASS"), the main latch 1411 of a page buffer has a logic state (A:1, B:0). On the other hand, when a threshold voltage of the memory cell is lower than the verify-read voltage Vfy2 (i.e., "PROGRAM FAIL"), the main latch 1411 is maintained at the logic state (A:0, B:1). First, an output node D0 is precharged to perform a column scan operation for the memory cells programmed to the target state P2. Precharging the output node D0 is shown on a signal path ⑧-1. Scan control signals Y-P2 and Y-ALL are then activated.

However, a transistor NM11 is turned on as the scan control signal Y-P2 is activated. Thus, in case of memory cells corresponding to the target states E0 and P3 where a node C of the cache latch 1412 has logic '1', charges precharged to the output node D0 are discharged by the ground transistor NM8. The discharge operation of the page buffer 141, which is performed to program the memory cells to the target states E0 and P3, is shown on a signal path ⑧-2. On the other hand, charges precharged to the output node D0 of the page buffer corresponding to the target state P2 is blocked from the discharge occurring via the ground transistor NM8. Accordingly, a transistor NM13 is switched only by the state of the main latch 1411 during the verify-read operation for the target state P2. In case of "PROGRAM PASS", the transistor NM13 is turned on by a signal of the node B that is inverted by an inverter INV1. Thus, a precharge voltage of the output node D0 is discharged to indicate "PROGRAM PASS". However, in the case where the sate of the main latch 1411 is logic (A:0, B:1) corresponding to "PROGRAM FAIL", the transistor NM13 is blocked and the output node D0 is maintained at the precharge state. The switching operation for the transistor NM13, based on the state of the node B of the main latch 1411, is shown on a signal path ⑧-3.

It is determined whether the selected memory cell is in the condition of "PROGRAM PASS" or "PROGRAM FAIL" according to the column scan operation (Y-Scan) for a page buffer corresponding to the memory cells programmed to the target state P2.

Figure 11:
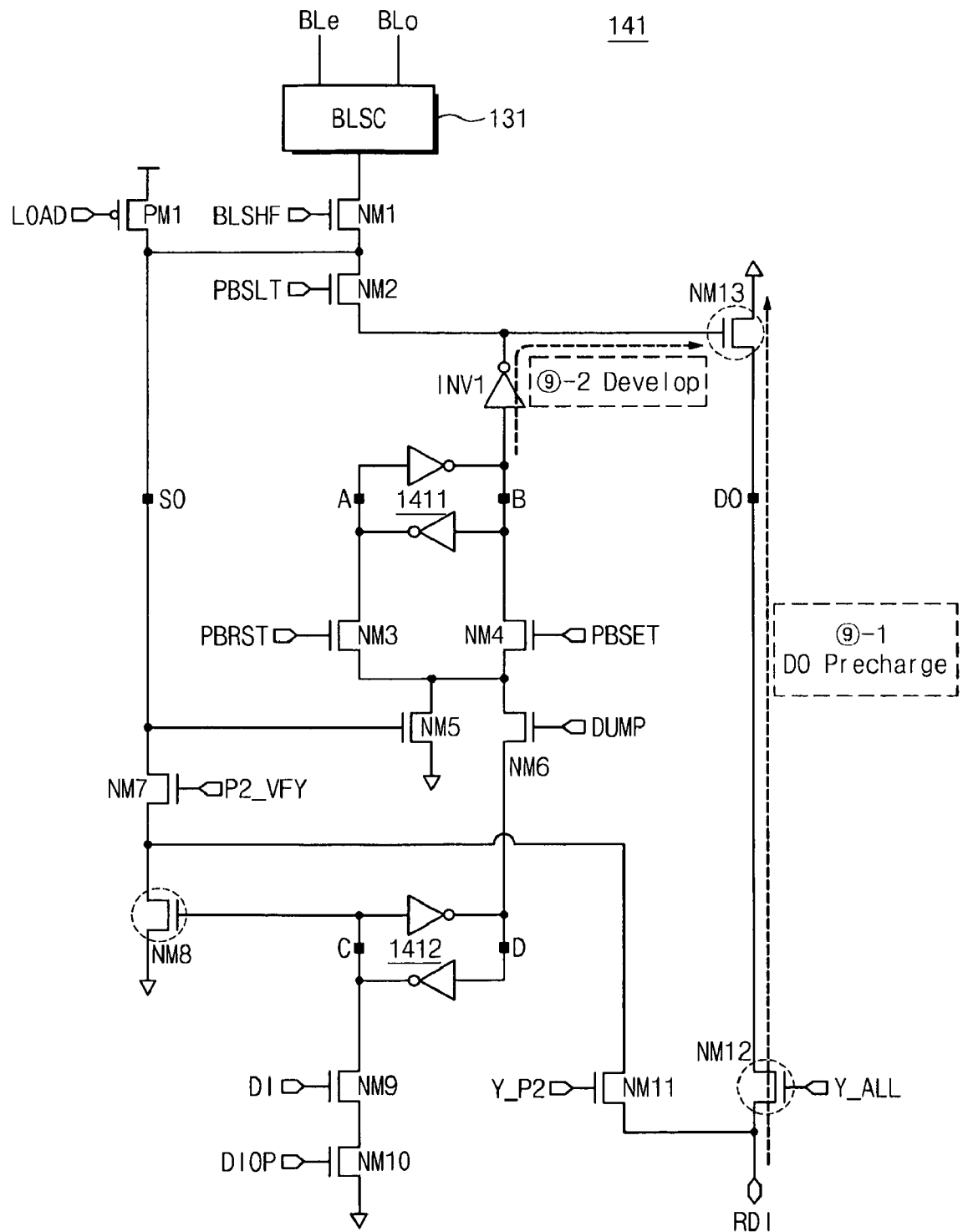
FIG. 11 is a circuit diagram illustrating a column scan operation of the memory cells programmed to the target state (P3).

FIG. 11 is a circuit diagram illustrating a column scan operation (Y-Scan) for outputting the verify-read result of the memory cells programmed to the target state P3. According to the selective verify-read operation for the memory cells programmed to the target state P3, which is previously described in FIG. 9, data is latched to the main latch 1411. When memory cells are normally programmed to the target state P3 (i.e., "PROGRAM PASS"), the main latch 1411 of a page buffer has a logic state (A:1, B:0). On the other hand, when a threshold voltage of the memory cell is lower than the verify-read voltage Vfy3 (i.e., "PROGRAM FAIL"), the main latch 1411 is maintained at the logic state (A:0, B:1). First, an output node D0 is precharged to perform a column scan operation for the memory cells programmed to the target state P2. Precharging the output node D0 is shown on a signal path ⑨-1. During the column scan operation for the target state P3, only a scan control signal Y-ALL is activated. Thus, the transistor NM13 is switched according to the state of the main latch 1411 to which verify-read result data is latched. In the case where the main latch 1411 has a logic state (A:1, B:0) corresponding to "PROGRAM PASS", the transistor NM13 is turned on by a signal of the node B that is inverted by the inverter INV1. Thus, a precharge voltage of the output node D0 is discharged to indicate "PROGRAM PASS". However, in the case where the sate of the main latch 1411 is logic (A:0, B:1) corresponding to "PROGRAM FAIL", the transistor NM13 is blocked and the output node D0 is maintained at the precharge state. The switching operation for the transistor NM13, based on the state of the node B of the main latch 1411, is shown on a signal path ⑨-2.

It is determined whether the selected memory cell is in the condition of "PROGRAM PASS" or "PROGRAM FAIL" according to the column scan operation for a page buffer corresponding to the memory cells programmed to the target state P3.

In view of the foregoing description, a page buffer includes two latch structures to perform a program operation to different target states P2 and P3. According to the present invention, the page buffer 141 commonly uses the ground transistor NM8 as a ground path used in a verify-read operation for the target state P2 and a ground path used in a column scan operation. Based on the above configuration of the page buffer, a verify-read operation for the target state P2 and a column scan operation may be skipped to enhance program performance.

Figure 12:
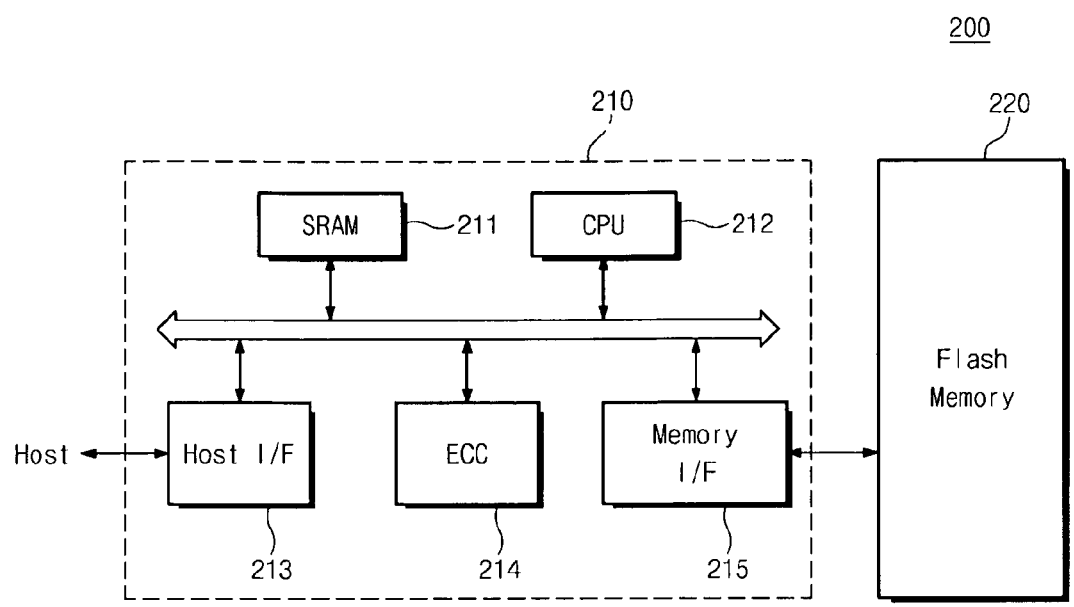
FIG. 12 is a block diagram of a memory system according to an embodiment of the present invention.

FIG. 12 is a block diagram of a memory system 200 including a flash memory device 220 designed to perform a program operation according to the present invention. The memory system 200 includes the flash memory device 220 and a memory controller 210. The flash memory device 220 is substantially identical to the flash memory device 100 illustrated in FIG. 1 and will not be described in further detail. The memory controller 210 is configured to control the flash memory device 220. The flash memory device 220 and the memory controller 210 may be provided to a memory card or a solid-state disk (SSD) after combining with each other.

An SRAM 211 is used as an operation memory of a processing unit 212. A host interface 213 has a data exchange protocol of the host connected to the memory system 200. An error correction block 214 detects and corrects error included in the data read from the flash memory device 220. A memory interface 214 interfaces with the flash memory device 220. A processing unit 212 performs various control operations for exchanging data of the memory controller 210. Although not shown, it will be understood by those skilled in the art that the memory system 200 may be further provided with a ROM (not shown) storing code data for interfacing with the host. The flash memory device 220 may be provided to a multi-chip package in which a plurality of memory chips are packed.

The above-described memory system 200 may program multi-bit data at high speed without increase of a chip area. Accordingly, the memory system 200 may be provided as a storage media of high capacity and high reliability. A memory system, such as a solid-state disk (SSD) that has been extensively studied in recent years, may be provided with a flash memory device according to the present invention. In this case, the memory controller 210 is configured to communicate with the exterior (e.g., host) via one of various interface protocols such as USB, MMC, PCI-E, SATA, PATA, SCSI, ESDI, and IDE.

Flash memory devices are non-volatile memory devices which are able to retain their stored data even when their power supplies are interrupted. With the increase in use of mobile devices such as cellular phones, PDAs, digital cameras, portable game consoles, and MP3 players, a flash memory device is being widely used as a code storage as well as a data storage. The SSD 410 including the nonvolatile memory device 412 and the SSD controller 411 may be used in home applications such as HDTV, DVD, router, and GPS.

Figure 13:
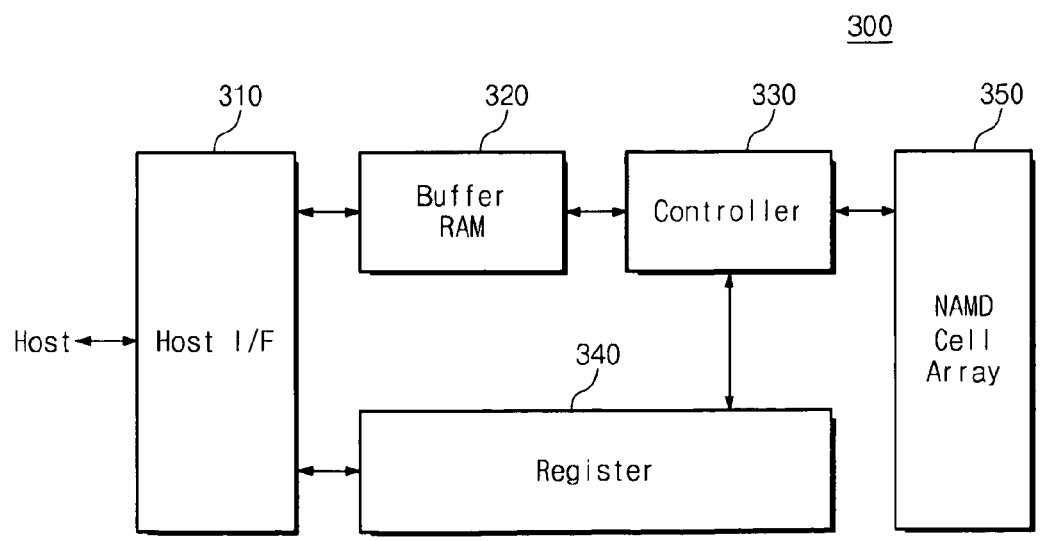
FIG. 13 is a block diagram of a fusion memory according to an embodiment of the present invention.

FIG. 13 is a block diagram of a fusion memory device including a buffer page structure according to the present invention. Technical features of the present inventions may be applied to a fusion memory device such as, for example, a OneNAND flash memory device 300. As shown in FIG. 13, the OneNAND flash memory device 300 includes a host interface 310, a buffer RAM 320, a controller 330, a register 340, and a NAND flash cell array 350. The host interface 310 exchanges various types of information with a device using a different protocol. A code for driving a memory device is included in the buffer RAM 320 or data is temporarily stored in the buffer RAM 320. The controller 330 controls read and program operations and all states in response to a control signal and an instruction that are externally provided. A register 340 is adopted to store an instruction, an address, and data such as configuration to define an internal system operation environment of the memory device. A NAND flash cell array 350 includes a non-volatile memory cell and a page buffer.

Figure 14:
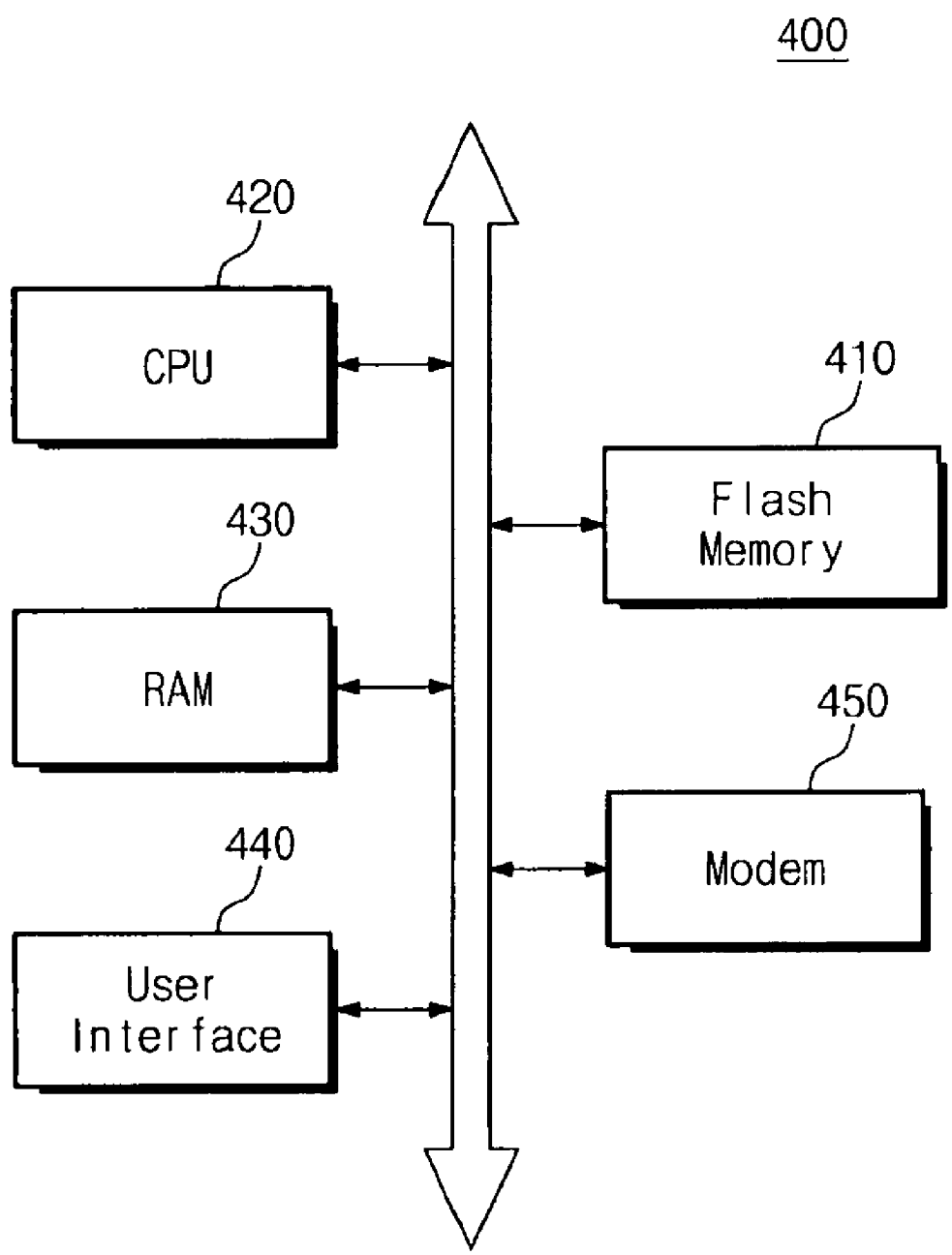
FIG. 14 is a block diagram of a computing system according to an embodiment of the present invention.

FIG. 14 shows a computing system 400 including a flash memory 410 according to the present invention. The computing system 400 includes a microprocessor 420, a RAM 430, a user interface 440, a modem 450 such as a baseband chipset, and the flash memory 410, which are electrically connected to a system bus (not shown). The flash memory 410 is substantially identical to that shown in FIG. 12 or 13. In the case where the computing system 400 is a mobile device, a battery (not shown) may be further provided to apply an operation voltage of the computing system. Although not shown in this figure, it will be understood by those skilled in the art that the computing system 400 may be further provided with an application chipset, a camera image processor (CIS), a mobile DRAM and so forth. The flash memory 410 may constitute, for example, a solid-state drive/disk (SSD) using a non-volatile memory to store data. Alternatively, the flash memory 400 may be provided as a fusion flash memory (e.g., OneNAND flash memory). A flash memory device and/or a memory controller according to the present invention may be mounted using various types of packages such as, for example, a package on package (PoP), Ball grid arrays (BGAs), Chip Scale Packages (CSPs), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-level Processed Stack Package (WSP).

According to the present invention, a non-volatile memory device can simultaneously program memory cells to two target states to reduce costs. A ground source is used in both a verify-read operation and a column scan operation to reduce a chip area.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A non-volatile memory device comprising:
   a cell array including a plurality of memory cells;
   a page buffer block controlling bitlines of the plurality of memory cells to program the memory cells to a first target state or a second target state; and
   a control logic configured to skip a verify operation for the memory cells programmed to the first target state and perform a verify operation for the memory cells programmed to the second target state during a second program loop when the memory cells programmed to the first target state are determined to be in a pass condition during a first program loop,
   wherein the page buffer block includes a plurality of page buffers,
   each of the page buffers comprising:
      a sensing node connected to a bitline of a selected memory cell;
      a first latch configured to store data sensed from the selected memory cell through the sensing node;
      a second latch configured to store data to be programmed to the selected memory cell;
      an output node for outputting the data of the first latch; and
      a ground circuit configured to ground the sensing node or the output node with reference to the second latch.

2. The non-volatile memory device of claim 1, wherein the first program loop comprises:
- an operation for providing a program voltage to a wordline of the plurality of memory cells;
- a verify-read operation for the memory cells programmed to the first target state and the memory cells programmed to the second target state; and
- a column scan operation for determining whether the memory cells programmed to the first target state and the second target state are in the pass condition according to the verify-read operation.

3. The non-volatile memory device of claim 2, wherein when the memory cells programmed to the first target state are determined to be in the pass condition according to the column scan operation, the control logic controls the page buffer block to skip the verify-read operation and the column scan operation for the memory cells programmed to the first target state during the second program loop.

4. The non-volatile memory device of claim 3, further comprising:
- a first transistor connecting the sensing node to the ground circuit during the verify-read operation for the memory cells programmed to the first target state; and
- a second transistor connecting the output node to the ground circuit during the column scan operation for the memory cells programmed to the first target state.

5. The non-volatile memory device of claim 4, wherein the second latch corresponding to the memory cells programmed to the second target state has a logic state to activate the ground circuit during the verify-read operation or the column scan operation for the memory cells programmed to the first target state.

6. The non-volatile memory device of claim 5, wherein the ground circuit includes a ground transistor having a gate connected to the second latch and switching between a ground and a common source of the first and second transistors.

7. The non-volatile memory device of claim 6, further comprising:
- a third transistor connecting the second transistor to the output node during the column scan operation for the memory cells programmed to the first target state and the second target state.

8. The non-volatile memory device of claim 7, wherein when a result of the column scan operation for the memory cell programmed to the first target state is determined to be in the pass condition, an activation operation of the first and second transistors is skipped during the second program loop.

9. The non-volatile memory device of claim 1, wherein the first target state has a threshold voltage distribution where the first target state is lower than the second target state, and the plurality of memory cells are simultaneously programmed to the first target state or the second target state.

10. A non-volatile memory device including a plurality of memory cells, comprising:
- a sensing node connected to a bitline of a selected memory cell;
- a first latch configured to store sensed data from the selected memory cell through the sensing node;
- a second latch configured to store data to be programmed to the selected memory cell;
- an output node for outputting the sensed data of the first latch;
- a ground circuit configured to activate or deactivate a verify-read operation through the sensing node or a column scan operation through the output node with reference to the data to be programmed of the second latch; and
- a verify circuit connecting the sensing node to the ground circuit during the verify-read operation and connecting the output node to the ground circuit during the column scan operation.

11. The non-volatile memory device of claim 10, wherein the sensed data is LSB data programmed to the selected memory cell, and the data to be programmed is MSB data to be programmed to the selected memory cell.

12. The non-volatile memory device of claim 11, wherein the selected memory cell is set to be programmed to a first target state or a second target state having a threshold voltage distribution where the second target state is higher than the first target state according to the LSB data or the MSB data.

13. The non-volatile memory device of claim 12, wherein the ground circuit is turned on when the MSB data stored in the second latch corresponds to the second target state.

14. The non-volatile memory device of claim 13, wherein the verify circuit comprises:
- a first transistor connecting the sensing node to the ground circuit during a verify-read operation corresponding to the first target state;
- a second transistor connecting the output node to the ground circuit during a column scan operation corresponding to the first target state; and
- a third transistor connecting the second transistor to the output node during the column scan operation corresponding to the first target state and a column scan operation corresponding to the second target state.

15. The non-volatile memory device of claim 14, wherein when the selected memory cell is determined to be programmed to the first target state during the column scan operation, the first and second transistors are controlled to be blocked during subsequent program loops.

16. The non-volatile memory device of claim 12, wherein when the LSB data sensed from the selected memory cell through the sensing node is stored, the first latch is set to be program-inhibited if the stored LSB data is within a threshold voltage range.

17. The non-volatile memory device of claim 10, wherein the ground circuit is a ground transistor having a gate connected to the second latch.

18. A memory system comprising:
- a non-volatile memory device; and
- a controller configured to control the non-volatile memory device,
- wherein the non-volatile memory device is a non-volatile memory device set forth in claim 1.

* * * * *